(12) United States Patent
Mullick et al.

(10) Patent No.: US 8,338,537 B2
(45) Date of Patent: *Dec. 25, 2012

(54) SURFACE MODIFYING MACROMOLECULES WITH HIGH DEGRADATION TEMPERATURES AND USES THEREOF

(75) Inventors: Sanjoy Mullick, Brampton (CA); Richard Witmeyer, Pittsboro, NC (US); Paul Santerre, Whitby (CA); Weilun Chang, North York (CA)

(73) Assignee: Interface Biologics Inc., Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/465,406

(22) Filed: May 7, 2012

(65) Prior Publication Data

US 2012/0220724 A1 Aug. 30, 2012

Related U.S. Application Data

(63) Continuation of application No. 13/185,985, filed on Jul. 19, 2011, now Pat. No. 8,178,620, which is a continuation of application No. 12/002,226, filed on Dec. 14, 2007, now Pat. No. 8,071,683.

(60) Provisional application No. 60/874,800, filed on Dec. 14, 2006.

(51) Int. Cl.
*C08F 8/30* (2006.01)
*C08F 8/00* (2006.01)
*C08F 12/00* (2006.01)
*C08F 10/04* (2006.01)

(52) U.S. Cl. ............ 525/123; 525/55; 526/89; 526/310; 623/1.1

(58) Field of Classification Search ............... 525/55, 525/123; 526/89, 301; 623/1.1
See application file for complete search history.

(56) References Cited

U.S. PATENT DOCUMENTS

| | | |
|---|---|---|
| 3,392,183 A | 7/1968 | Windemuth et al. |
| 3,872,058 A | 3/1975 | Gresham |
| 4,584,362 A | 4/1986 | Leckart et al. |
| 4,792,354 A | 12/1988 | Matsuo et al. |
| 4,861,830 A | 8/1989 | Ward |
| 5,242,995 A | 9/1993 | Kim et al. |
| 5,486,570 A | 1/1996 | St. Clair |
| 5,542,200 A | 8/1996 | Matsuoka |
| 5,589,563 A | 12/1996 | Ward et al. |
| 5,908,701 A | 6/1999 | Jennings et al. |
| 5,929,201 A | 7/1999 | Gibbons et al. |
| 6,127,507 A * | 10/2000 | Santerre .................. 528/66 |

(Continued)

FOREIGN PATENT DOCUMENTS

EP 0 073 978 8/1982

(Continued)

OTHER PUBLICATIONS

U.S. Appl. No. 08/690,108, filed Jul. 31, 1996, Santerre et al.

(Continued)

*Primary Examiner* — Randy Gulakowski
*Assistant Examiner* — Kara Boyle
(74) *Attorney, Agent, or Firm* — Clark & Eibing LLP; Kristina Bieker-Brady

(57) ABSTRACT

The invention relates to surface modifying macromolecules (SMMs) having high degradation temperatures and their use in the manufacture of articles made from base polymers which require high temperature processing. The surface modifier is admixed with the base polymer to impart alcohol and water repellency properties.

20 Claims, 10 Drawing Sheets

U.S. PATENT DOCUMENTS

| | | | |
|---|---|---|---|
| 6,448,364 | B1 | 9/2002 | Clatty et al. |
| 8,071,683 | B2 * | 12/2011 | Mullick et al. ............... 525/123 |
| 8,178,620 | B2 * | 5/2012 | Mullick et al. ............... 525/123 |
| 2004/0121175 | A1 | 6/2004 | Flexman et al. |
| 2005/0176893 | A1 | 8/2005 | Rana et al. |

FOREIGN PATENT DOCUMENTS

| | | |
|---|---|---|
| EP | 0 231 927 | 2/1987 |
| EP | 0 335 664 | 3/1989 |
| WO | WO 95/26993 | 10/1995 |
| WO | WO 97/06195 | 2/1997 |
| WO | WO2007/084514 | 7/2007 |
| WO | WO 2010/025398 | 3/2010 |
| WO | PCT/CA2010/000746 | 5/2010 |

OTHER PUBLICATIONS

U.S. Appl. No. 12/780,200, filed May 14, 2010, Mullick et al.

U.S. Appl. No. 12/834,730, filed Jul. 12, 2010, Mullick et al.

U.S. Appl. No. 13/060,542, filed Feb. 24, 2011, Mullick et al.

U.S. Appl. No. 13/323,427, filed Dec. 12, 2011, Mullick et al.

Engelberg et al., "Physico-Mechanical Properties of Degradable Polymers Used in Medical Applications: A Comparative Study," *Biomaterials*, 12: 292-304 (1991).

Goldberg, "Elastomeric Polycarbonate Block Copolymers," *Journal of Polymer Science: Part C*, 4: 707-730 (1963).

Jin et al., "Thermotropic Liquid Crystalline Polyesters With Rigid or Flexible Spacer Groups," *The British Polymer Journal*. 132-146 (1980).

Kakimoto et al., "Preparation and Properties of Fluorine-Containing Polyarylates From Tetrafluoroisophthaloyl Chloride and Bisphenols," *J. Polym. Sci., Part A, Polym. Chem*.25: 2747-2753 (1987).

Kulesza et al., "Thermal Decomposition of Bisphenol A-Based Polyetherurethanes Blown With Pentane Part I-Thermal and Pyrolytical Studies," *J. Anal. Appl. Pyrolysis*, 76: 243-248 (2006).

La Mantia et al., "Thermo-Mechanical Degradation of Polymer Blends," *Die Angewandte Makromolekulare Chemie*, 216: 45-65 (1994).

Liaw et al., "Curing Kinetics of Epoxy Resins Based on Bisphenol-S and its Derivatives," *Die Angewandte Makromolekulare Chemie*, 200: 137-146 (1992).

Liaw et al., "Synthesis of Epoxy Resins Based on Bisphenol-S and its Derivatives," *Die Angewandte Makromolekulare Chemie*, 199: 171-190 (1992).

Liaw et al., "Radical Polymerization of Mono- and Di-Methacrylic Esters Containing Bisphenol-S," *Die Angewandte Makromolekulare Chemie*, 207: 43-52 (1993).

Liaw et al., "Curing of Acrylated Epoxy Resin Based on Bisphenol-S," *Polymer Engineering and Science*, 34(16): 1297-1303 (1994).

Liaw, "The Relative Physical and Thermal Properties of Polyurethane Elastomers: Effect of Chain Extenders of Bisphenols, Diisocyanate, and Polyol Structures," *J. Appl. Polym. Sci.*, 66: 1251-1265 (1997).

Marks, "Interfacial Synthesis and Characterization of Random and Segmented Block Bisphenol A-Tetrabromobisphenol A Copolycarbonates," *J. Appl. Polym. Sci.*, 52: 467-481 (1994).

Maruyama et al., "Synthesis and Properties of Polyarylates From 2,2-Bis(4-hydroxyphenyl)-1,1,1,3,3,3-Hexafluoropropane and Aromatic Diacid Chlorides," *J. Polym. Sci., Part A, Polym. Chem*.24: 3555-3558 (1986).

Maruyama et al., "Synthesis and Properties of Fluorine-Containing Aromatic Polybenzoxazoles From Bis(o-aminophenols) and Aromatic Diacid Chlorides by the Silylation Method," *Macromolecules*, 21(8): 2305-2309 (1988).

Nagata et al., "Synthesis and Properties of Polyamides Derived from Systematically Halogenated Terephthalic Acids with Fluorine, Chlorine, or Bromine Atoms," *J. Polym. Sci., Part A, Polym. Chem*.26: 235-245 (1988).

Shimizu et al., "Synthesis and Characterization of Fluorine-Countaining Aromatic Polyethers From Tetrafluoroisophthalonitrile and Bisphenols," *J. Polym. Sci., Part A, Polym. Chem*.25: 2385-2393 (1987).

Suk et al., "Study on the Kinetics of Surface Migration of Surface Modifying Macromolecules in Membrane Preparation," *Macromolecules* 35: 3017-3021, 2002.

Sukumar et al., "Synthesis and Thermal Studies of Block Copolymers from NR and MDI-Based Polyurethanes," *J. Appl. Polym. Sci.* 111: 19-28 (2009).

Tang et al., "Synthesis of Surface-Modifying Macromolecules for Use in Segmented Polyurethanes," *J. Appl. Polym. Sci.* 62:1133-1145 (1996).

Tang et al., "Use of Surface-Modifying Macromolecules to Enhance the Biostability of Segmented Polyurethanes," *J. Biomed. Mater. Res.* 35:371-381 (1997).

European Search Report from European Patent Application No. 07862900.3, dated Jun. 20, 2011.

Extended European Search Report from European Patent Application No. 07862900.3, dated Jul. 27, 2010.

International Search Report and Written Opinion for PCT/US 07/25577 mailed Apr. 17, 2008.

International Preliminary Report on Patentability for PCT/US07/25577 issued Jun. 16, 2009.

Office Action pertaining to U.S. Appl. No. 08/690,108 mailed Oct. 31, 1997.

Office Action pertaining to U.S. Appl. No. 08/690,108 mailed Apr. 24, 1998.

Office Action pertaining to U.S. Appl. No. 12/002,226 mailed Jan. 26, 2010.

Office Action pertaining to U.S. Appl. No. 12/002,226 mailed Oct. 5, 2010.

* cited by examiner

115°

125°

123°

42°

75°

64°

SURFACE MODIFYING MACROMOLECULES WITH HIGH DEGRADATION TEMPERATURES AND USES THEREOF

CROSS-REFERENCE TO RELATED APPLICATIONS

This application is a continuation of, and claims priority from, U.S. patent application Ser. No. 13/185,985, filed Jul. 19, 2011, which is a continuation of U.S. patent application Ser. No. 12/002,226, filed Dec. 14, 2007, now U.S. Pat. No. 8,071,683, which claims the benefit of U.S. Provisional Application No. 60/874,800, filed Dec. 14, 2006, each of which is hereby incorporated by reference in its entirety.

BACKGROUND OF THE INVENTION

The invention relates to surface modifying macromolecules (SMMs) having high degradation temperatures and their use in the manufacture of articles made from base polymers which require high temperature processing.

Various fluorochemicals have been used to impart water and oil repellency, as well as soil resistance, to a variety of substrates. These fluorochemicals have most often been applied topically (for example, by spraying, padding, or finish bath immersion). The resulting repellent substrates have found use in numerous applications where water and/or oil repellency (as well as soil resistance) characteristics are valued, such as in protective garments for medical technicians and laboratory workers. The repellent substrates can be used, for example, where it is desirable to prevent passage of blood, blood-borne pathogens, and other body fluids across the fabric (i.e., to block exposure to chemically toxic or infectious agents); and to reduce exposure to low surface tension chemicals, such as alcohols, ketones, and aldehydes.

Medical care garments and protective wear garments used commercially are often fully or partially constructed of extruded articles e.g. thermoplastic films, thermoplastic fibers, fibrous non-woven materials, thermoplastic foam materials etc. Examples of these products are in surgical drapes, gowns and bandages, protective wear garments (e.g., workers overalls, facemasks, and labcoats, among others). These materials require high temperature processing conditions often exceeding 200° C.

Many fluorochemicals lack the requisite thermal stability to be processed at temperatures above 200° C. (for example, in melt spun applications where high extrusion temperatures often exceeding 275-300° C. are involved).

Thus, there remains a need for thermally stable additives which can be used in admixture with base polymers that require high temperature processing to impart water and/or oil repellency.

SUMMARY OF THE INVENTION

The invention provides surface modifying macromolecule (SMM) additives having high degradation temperatures. These SMMs are useful in the manufacture of articles made from base polymers which require high temperature processing.

Accordingly, in a first aspect the invention features a surface modifier of formula (I):

$$G\text{-}[B\text{-}A]_n\text{-}B\text{-}G \qquad (I)$$

In formula (I), A is a soft segment including hydrogenated polybutadiene, poly(2,2 dimethyl-1-3-propylcarbonate), polybutadiene, poly(diethylene glycol)adipate, diethylene glycol-ortho phthalic anhydride polyester, or 1,6-hexanediol-ortho phthalic anhydride polyester; B is a hard segment including a urethane; G is a surface active group; and n is an integer from 1 to 10. Surface modifiers of formula (I) can have a thermal degradation temperature of at least 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, or even 355° C. In certain embodiments, the surface modifier has a thermal degradation temperature of between 200 and 345° C., 220 and 345° C., 250 and 345° C., 275 and 345° C., or 300 and 345° C. In other embodiments, the soft segment includes hydrogenated polybutadiene or poly(2,2 dimethyl-1-3-propylcarbonate). In still other embodiments, the hard segment is 4,4'-methylene bis(cyclohexyl urethane) and n is 1 or 2.

In a related aspect the invention features a surface modifier of formula (I):

$$G\text{-}[B\text{-}A]_n\text{-}B\text{-}G \qquad (I)$$

In formula (I), A is a soft segment including poly(hexamethylene carbonate), poly(ethylene-co-butylene), 1,6-hexanediol-ortho phthalic anhydride polyester, neopentyl glycol-ortho phthalic anhydride polyester, or bisphenol A ethoxylate; B is a hard segment including a urethane; G is a surface active group; and n is an integer from 1 to 10.

Surface modifiers can be prepared by reacting a diisocyanate (e.g., 3-isocyanatomethyl, 3,5,5-trimethyl cyclohexylisocyanate; 4,4'-methylene bis(cyclohexyl isocyanate); 4,4'-methylene bis(phenyl)isocyanate; toluene-2,4 diisocyanate); m-tetramethylxylene diisocyanate and hexamethylene diisocyanate) with a soft segment diol to form a prepolymer. The prepolymer can then be reacted with monohydroxylic surface active group to form the surface modifier. Desirably, the reactions are performed in the presence of a bismuth carboxylate catalyst.

In certain embodiments, the soft segment has a number average molecular weight, $M_n$, of 1,000 to 3,500 Daltons.

In still other embodiments, the surface active group has a molecular weight of between 100-1,500 Daltons. Surface active groups include, without limitation, polydimethylsiloxanes, hydrocarbons, polyfluoroalkyl, fluorinated polyethers, and combinations thereof. Desirably, the surface active group is a polyfluoroalkyl, such as 1H,1H,2H,2H-perfluoro-1-decanol; 1H,1H,2H,2H-perfluoro-1-octanol; 1H,1H,5H-perfluoro-1-pentanol; and 1H,1H, perfluoro-1-butanol, or mixtures thereof or a radical of the general formulas $CF_3(CF_2)_r$ $CH_2CH_2$— wherein r is 2-20, and $CF_3(CF_2)_s(CH_2CH_2O)_\chi$ wherein $\chi$ is 1-10 and s is 1-20.

In certain embodiments, n is an integer from 1-5. Desirably, n is 1 or 2.

The surface modifiers of the invention can have a theoretical molecular weight of less than 25 kDa, desirably less than 20 kDa, 18 kDa, 16 kDa, 15 kDa, 14 kDa, 13 kDa, 12 kDa, 11 kDa, 10 kDa, 8 kDa, 6 kDa, or even 4 kDa.

The surface modifiers of the invention can include from 5% to 35%, 10% to 35%, 5 to 30%, 10 to 30%, 5 to 20%, 5 to 15%, or 15 to 30% (w/w) of the hard segment; from 40 to 90%, 50 to 90%, 60 to 90%, 40 to 80%, or 40 to 70% (w/w) of the soft segment; and from 5 to 40%, 5 to 30%, 5 to 40%, 10 to 40%, 10 to 30%, or 5 to 20%, (w/w) of the surface active group.

The invention also features an admixture including a surface modifier of the invention admixed with a base polymer. In certain embodiments, the base polymer is selected from polypropylenes, polyethylenes, polyesters, polyurethanes, nylons, polysilicones, polystyrene, poly(methyl methacrylates), polyvinylacetates, polycarbonates, poly(acrylonitrile-butadiene), styrene, polyvinylchloride, and blends thereof.

For example, SMMs including hydrogenated polybutadiene can be admixed with polypropylenes or polyethylenes, SMMs including poly(2,2 dimethyl-1-3-propylcarbonate) can be admixed with polyurethanes, and SMMs including poly(ethylene-co-butylene) can be admixed with polyethylenes or polyurethanes.

The admixtures can be prepared by (i) combining the base polymer and the surface modifier to form a mixture, and (ii) heating the mixture above 200° C., 220° C., 250° C., 270° C., or 300° C. The admixtures of the invention contain from 0.05% to 20%, 0.05% to 15%, 0.05% to 13%, 0.05% to 10%, 0.05% to 5%, 0.05% to 3%, 0.5% to 15%, 0.5% to 10%, 0.5% to 6%, 0.5% to 4%, 1% to 15%, 1% to 10%, 1% to 8%, 1% to 6%, 1% to 5%, 2% to 5%, or 4% to 8% (w/w) surface modifier.

The invention further features an article formed from an admixture of the invention. Articles that can be formed using the admixtures of the invention include, without limitation, surgical caps, surgical sheets, surgical covering clothes, surgical gowns, masks, gloves, surgical drapes, filter (e.g., part of a respirator, water filter, air filter, or face mask), cables, films, panels, pipes, fibers, sheets, and implantable medical device (e.g., a cardiac-assist device, a catheter, a stent, a prosthetic implant, an artificial sphincter, or a drug delivery device).

The invention also features a method for making an article by (i) combining a base polymer with a surface modifier of the invention to form a mixture, and (ii) heating the mixture to at least 250° C. Desirably, the mixture is heated to a temperature of between 250° C. and 345° C.

The invention further features a method for increasing the thermal degradation temperature of a surface modifier of formula (I):

G-[B-A]$_n$-B-G   (I)

In formula (I), A is a soft segment; B is a hard segment including a urethane; G is a surface active group; and n is an integer from 1 to 10. The method includes the steps of (a) reacting a diisocyanate with a diol soft segment to form a prepolymer; and (b) reacting the prepolymer with a monohydroxylic surface active group, wherein step (a) or (b) is performed in the presence of a bismuth carboxylate catalyst. In certain embodiments the diol soft segment is selected from hydrogenated-hydroxyl terminated polybutadiene, poly(2,2 dimethyl-1-3-propylcarbonate)diol, poly(hexamethylene carbonate)diol, poly(ethylene-co-butylene)diol, hydroxyl terminated polybutadiene polyol, poly(diethylene glycol)adipate, poly(tetramethylene oxide)diol, diethylene glycol-ortho phthalic anhydride polyester polyol, 1,6-hexanediol-ortho phthalic anhydride polyester polyol, neopentyl glycol-ortho phthalic anhydride polyester polyol, and bisphenol A ethoxylate diol. In certain embodiments, step (a) includes reacting a diisocyanate with hydrogenated-hydroxyl terminated polybutadiene or poly(2,2 dimethyl-1-3-propylcarbonate)diol. In other embodiments, the diisocyanate is selected from 3-isocyanatomethyl, 3,5,5-trimethyl cyclohexylisocyanate; 4,4'-methylene his (cyclohexyl isocyanate); 4,4'-methylene his (phenyl)isocyanate; toluene-2,4 diisocyanate); and hexamethylene diisocyanate. Monohydroxylic surface active groups useful in making the SMMs of the invention include any disclosed herein. In certain embodiments the monohydroxylic surface active group is selected from compounds of the general formula $CF_3(CF_2)_rCH_2CH_2OH$ wherein r is 2-20, and $CF_3(CF_2)_s(CH_2CH_2O)_\chi CH_2CH_2OH$ wherein $\chi$ is 1-10 and s is 1-20.

As used herein, "surface modifier" refers to relatively low molecular weight polymers containing a central portion of less than 20 kDa and covalently attached to at least one surface active group. The low molecular weight of the surface modifier allows for diffusion among the macromolecular polymer chains of a base polymer.

By "surface active group" is meant a lipophilic group covalently tethered to a surface modifier. The surface active group can be positioned to cap one or both termini of the central polymeric portion of the surface modifier or can be attached to one or more side chains present in the central polymeric portion of the surface modifier. Examples of surface active groups include, without limitation, polydimethylsiloxanes, hydrocarbons, polyfluoroalkyl, fluorinated polyethers, and combinations thereof.

As used herein, the term "thermal degradation temperature" refers to the temperature at which there is an onset of weight loss (a first onset representing a small weight loss, followed by a second onset at a considerably higher temperature representing the major fraction of the weight) of the SMM during thermographic analysis.

The thermal stability of the SMMs have also been tested under rigorous heating conditions e.g. 220, 260 and 300° C. for 10 and 25 minutes and the corresponding weight losses have been determined at these temperatures. These are typical temperatures experienced by polymers during processing at conditions that require high temperatures. The prolonged heating times of 10 and 25 minutes under isothermal conditions are rather harsh where in reality the polymers would only experience shorter residence time during actual processing (~1-5 minutes) Additionally, the prolonged heating times are to test the integrity of these surface modified Polymers and gauge the extent of degradation through the weight losses occurring at 10 and 25 minutes. This analysis is described in Example 13.

Other features and advantages of the invention will be apparent from the Drawings, Detailed Description, and the claims.

DETAILED DESCRIPTION

Figure 1:
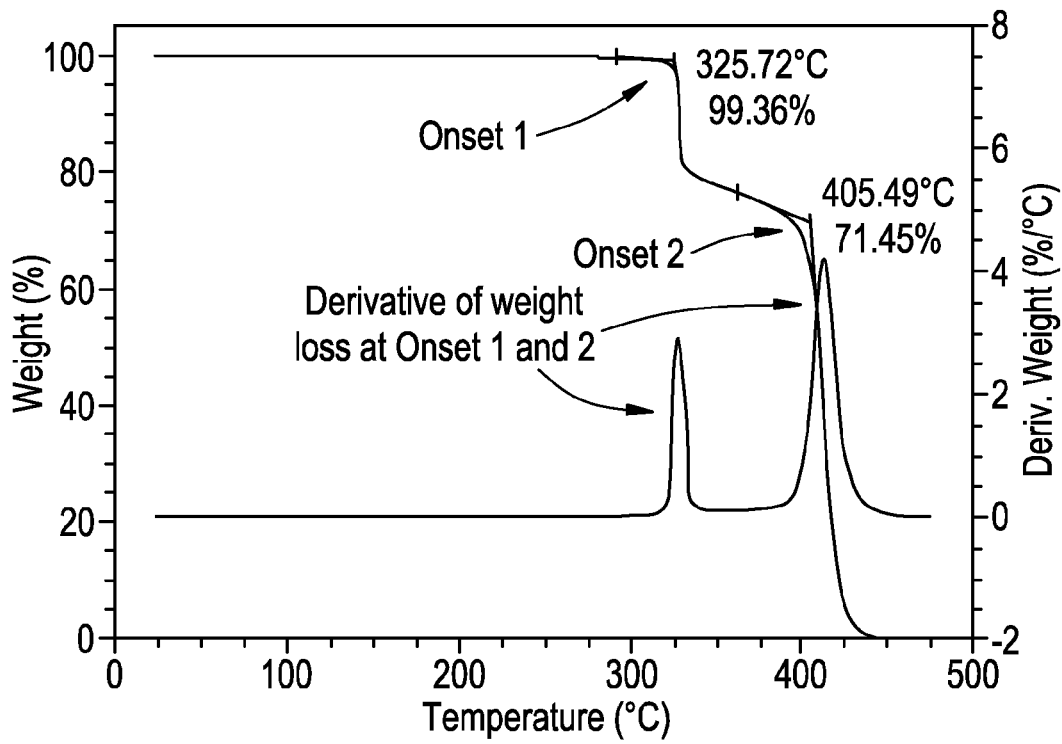
FIG. 1 is a graph depicting the High Resolution Thermogravimetric profile of SMM (1) indicating a first onset at a degradation temperature $T_{d1}$ 326° C., representing a minor weight loss (−0.87%) followed by a major weight loss at $T_{d2}$ at 405° C. (−29.4%).
Figure 2:
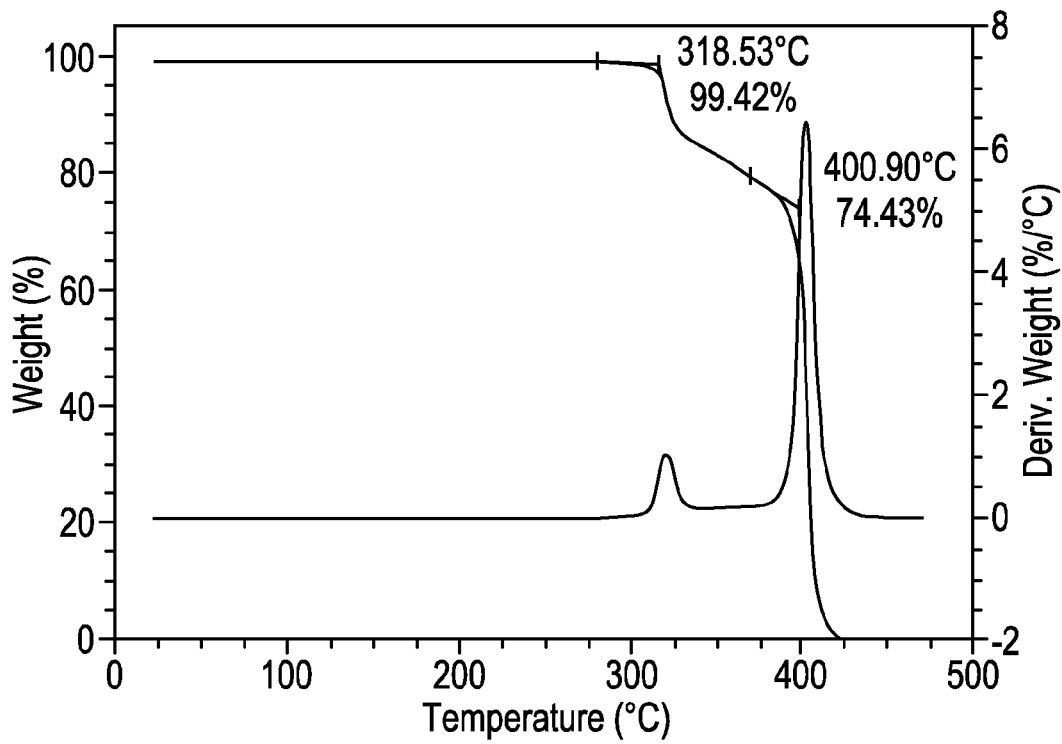
FIG. 2 is a graph depicting the High Resolution Thermogravimetric profile of SMM (2) indicating a first onset at a degradation temperature $T_{d1}$ 319° C., representing a minor weight loss (−0.79%) followed by a major weight loss at $T_{d2}$ of 401° C. (−26%).
Figure 3:
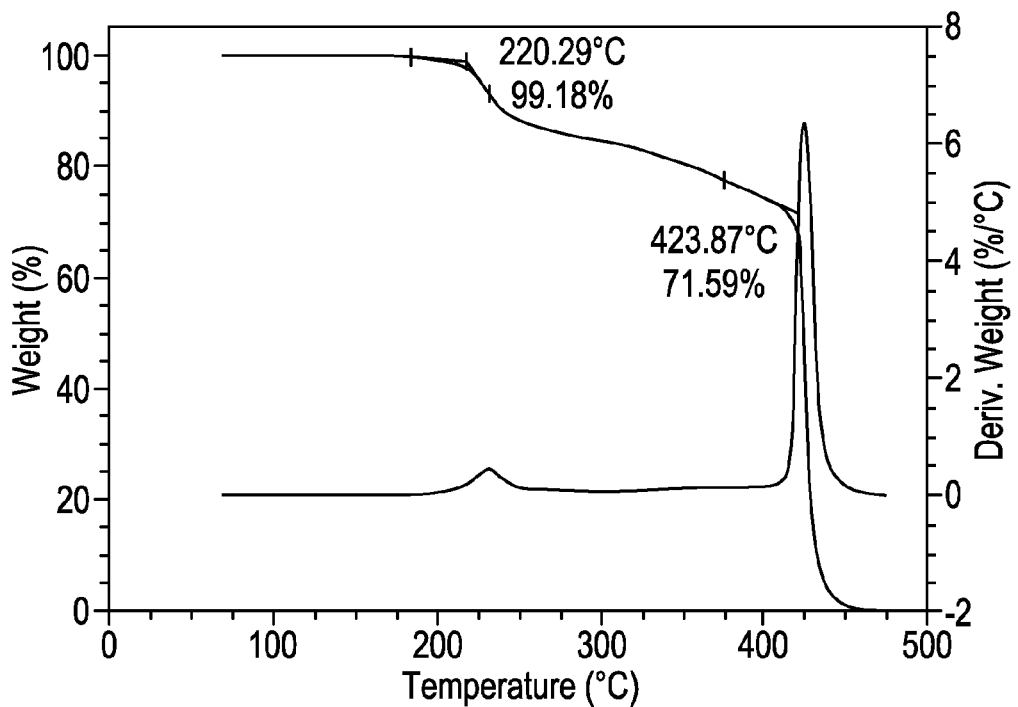
FIG. 3 is a graph depicting the High Resolution Thermogravimetric profile of SMM (3) indicating a first onset at a degradation temperature $T_{d1}$ 220° C., representing a minor weight loss (−0.82%) followed by a major weight loss at $T_{d2}$ of 424° C. (−28.4%).
Figure 4:
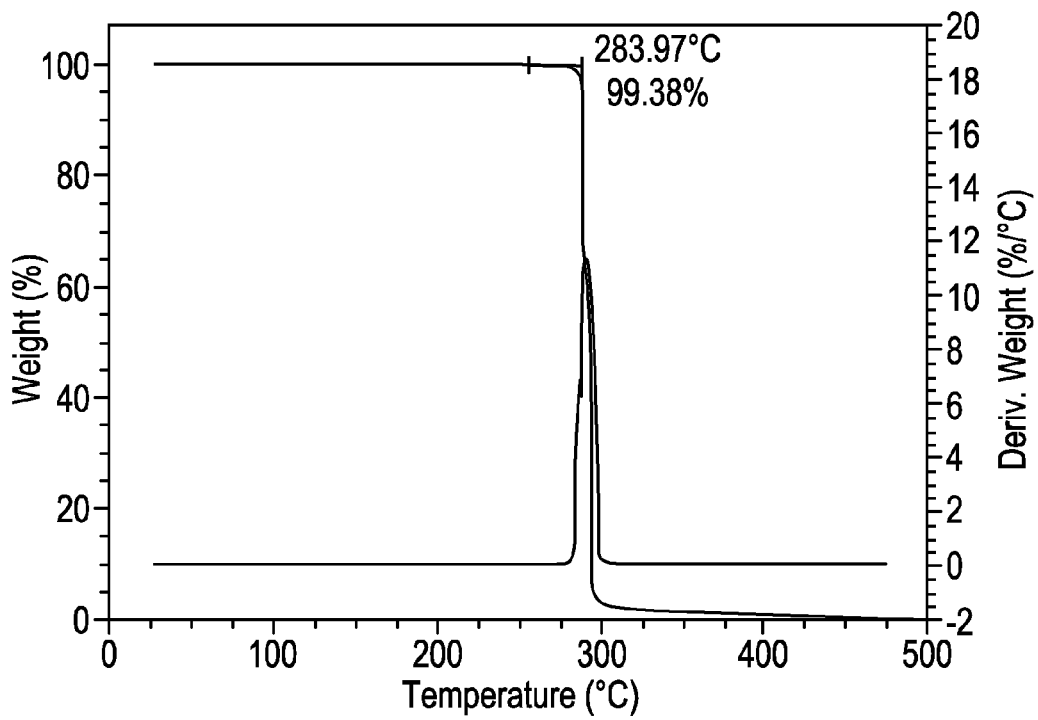
FIG. 4 is a graph depicting the High Resolution Thermogravimetric profile of SMM (4) indicating essentially a single onset at a degradation temperature $T_d$ 284° C., which starts off with a small weight loss of 0.62% followed immediately by a major weight loss of >90%.
Figure 5:
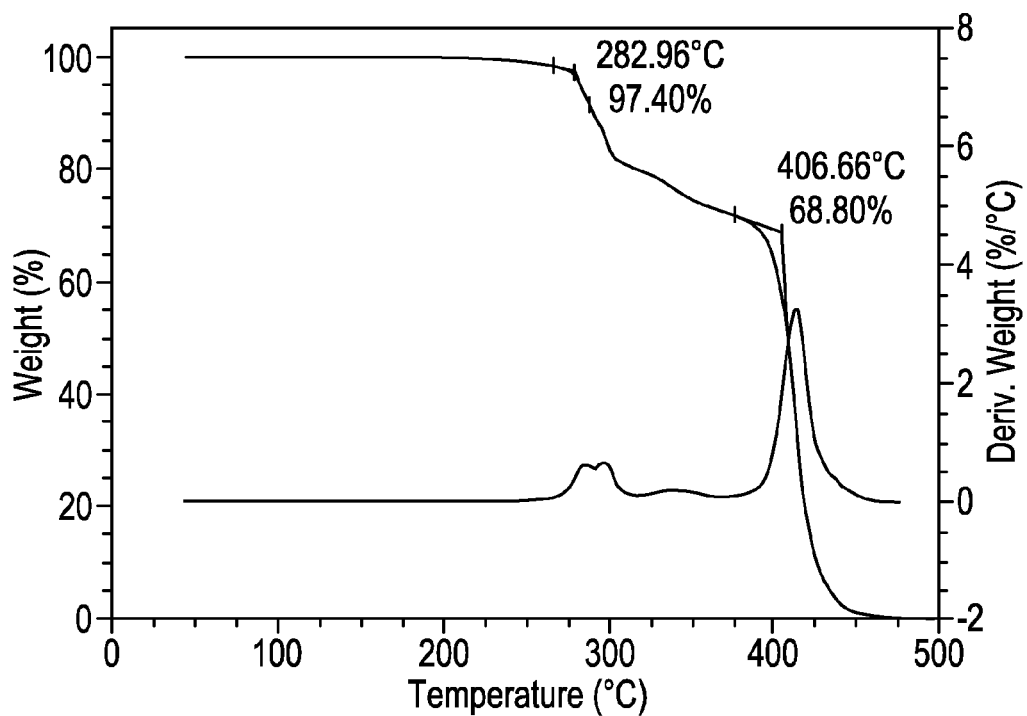
FIG. 5 is a graph depicting the High Resolution Thermogravimetric profile of SMM (5) indicating a first onset at a degradation temperature $T_{d1}$ 283° C., representing a minor weight loss (−2.6%) followed by a major weight loss at $T_{d2}$ of 407° C. (−31.2%).
Figure 6:
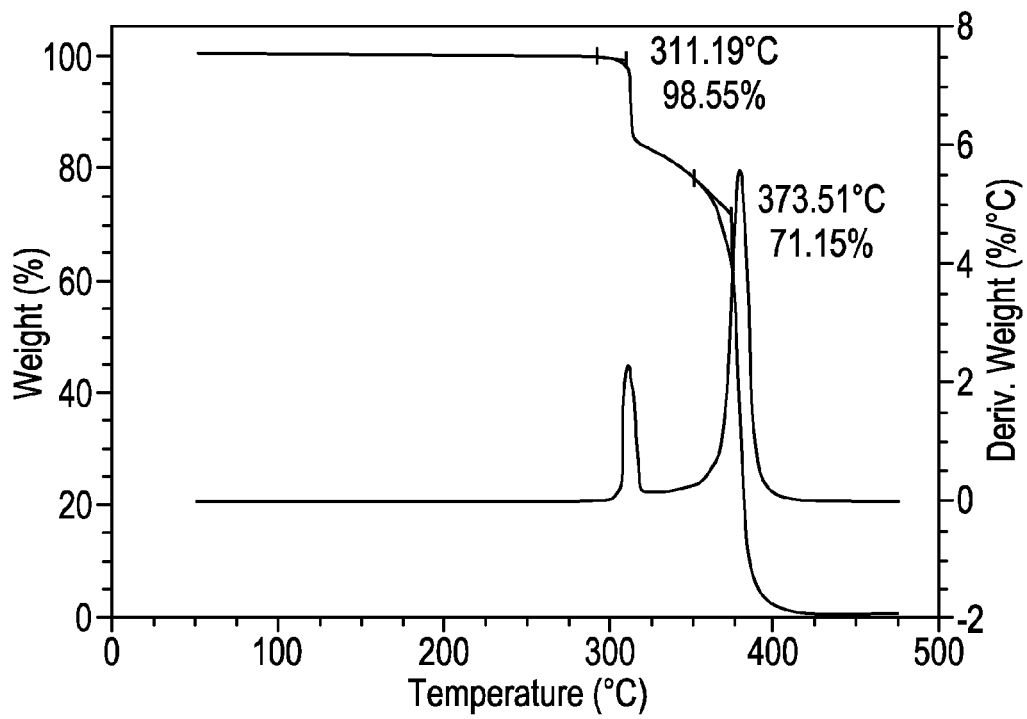
FIG. 6 is a graph depicting the High Resolution Thermogravimetric profile of SMM (6) indicating a first onset at a degradation temperature $T_{d1}$ 311° C., representing a minor weight loss (−1.5%) followed by a major weight loss at $T_{d2}$ of 374° C. (−28.9%).
Figure 7:
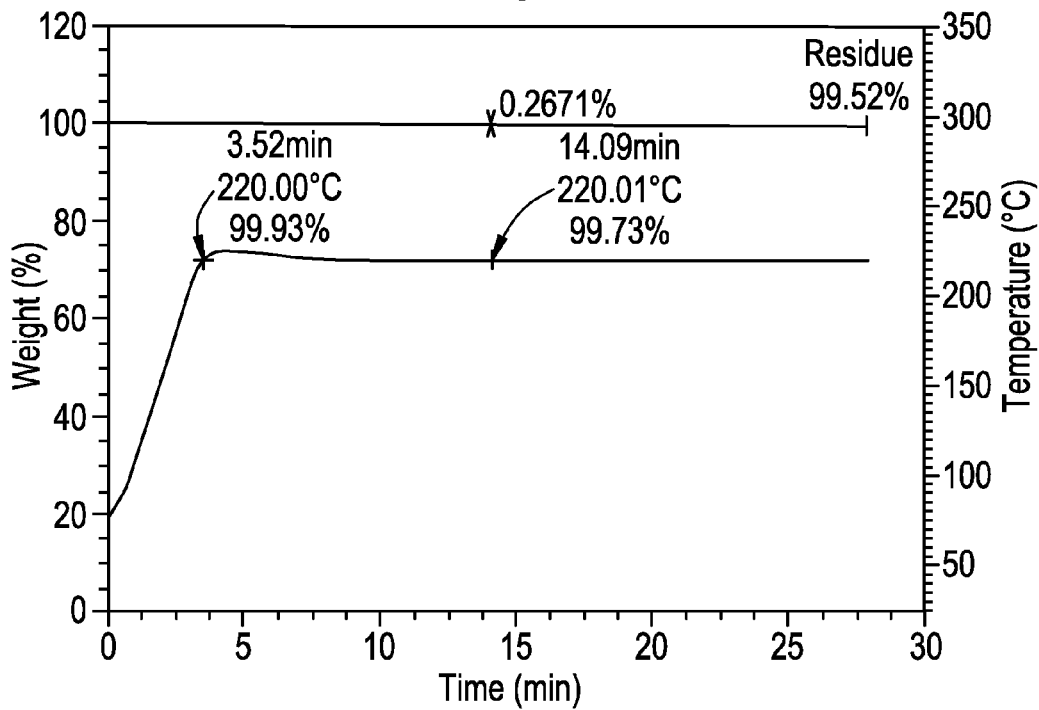
FIG. 7 is a graph depicting the Isothermal Decomposition Profile of SMM (1) when heated at 220° C. for 25 minutes under Nitrogen. The profile shows a small weight loss at of 0.27% after 10 minutes and 0.48% after 25 minutes isothermal heating.
Figure 8:
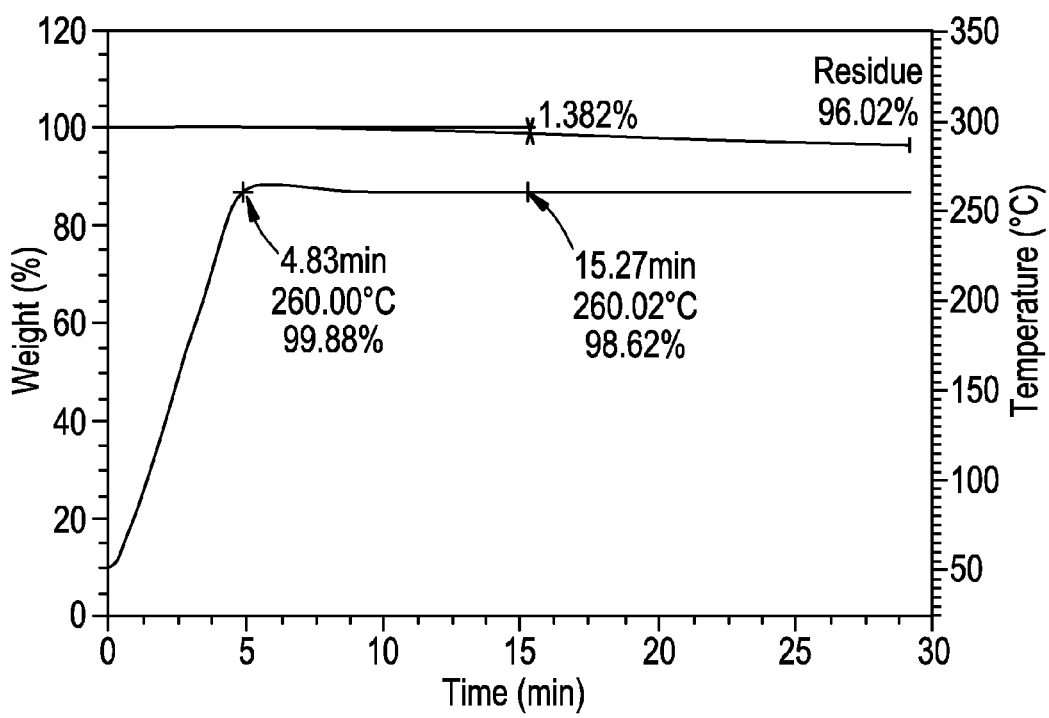
FIG. 8 is a graph depicting the Isothermal Decomposition Profile of SMM (1) when heated at 260° C. for 25 minutes under Nitrogen. The profile shows a small weight loss at of 1.38% after 10 minutes and 4% after 25 minutes isothermal heating.
Figure 9:
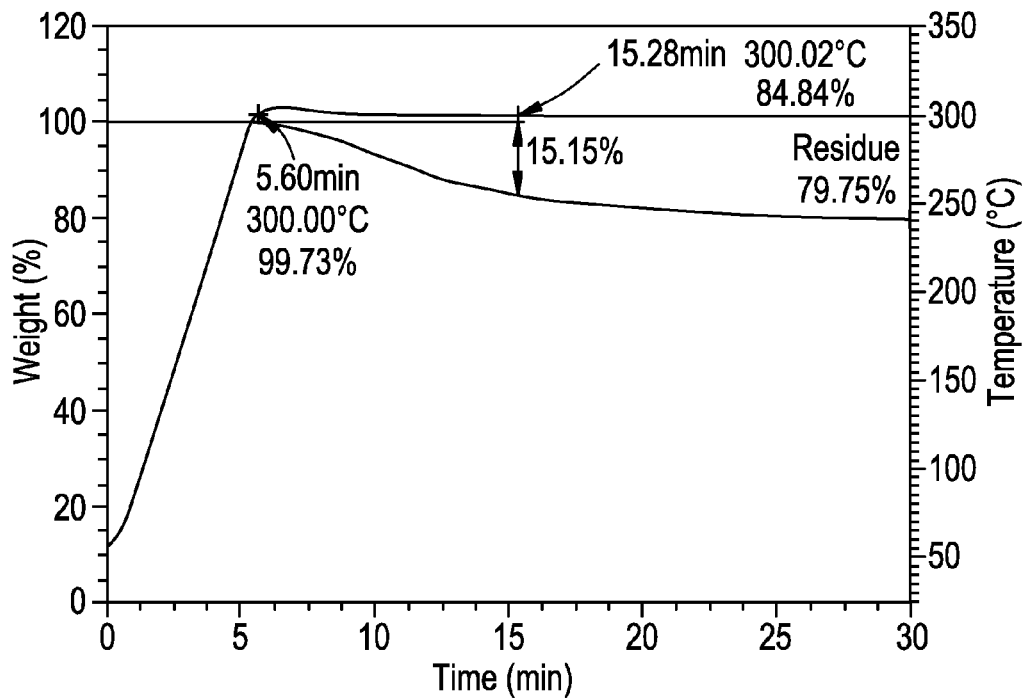
FIG. 9 is a graph depicting the Isothermal Decomposition Profile of SMM (1) when heated at 300° C. for 25 minutes under Nitrogen. The profile shows a 15% weight loss after 10 minutes and 20% weight loss after 25 minutes isothermal heating.
Figure 10:
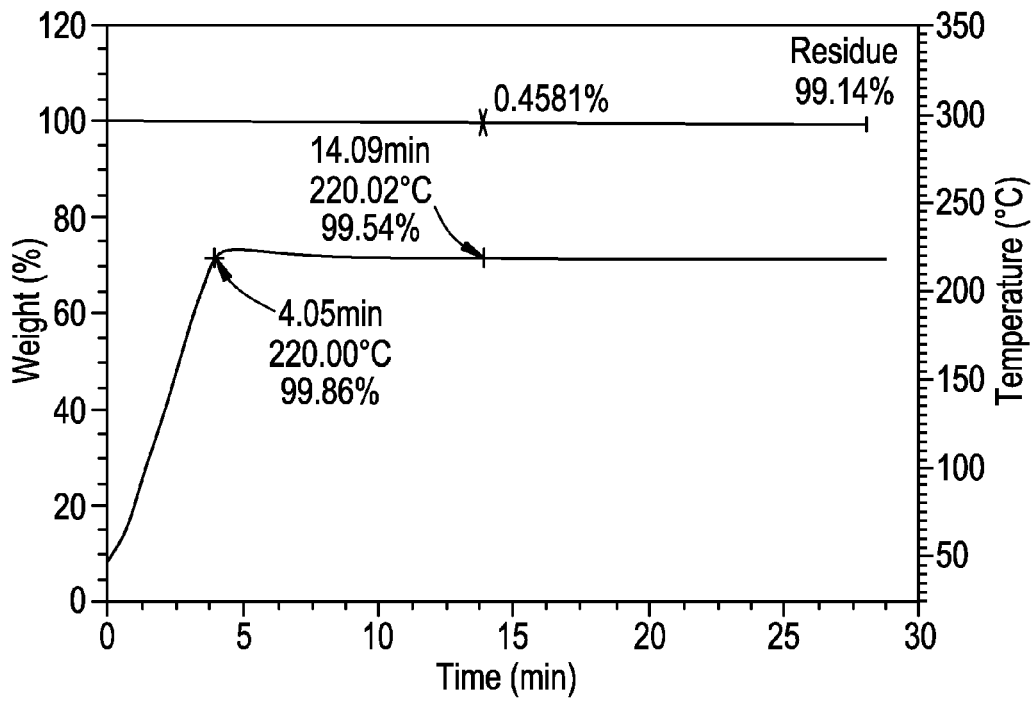
FIG. 10 is a graph depicting the Isothermal Decomposition Profile of SMM (2) when heated at 220° C. for 25 minutes under Nitrogen. The profile shows a small weight loss of 0.46 after 10 minutes and 0.86% weight loss after 25 minutes isothermal heating.
Figure 11:
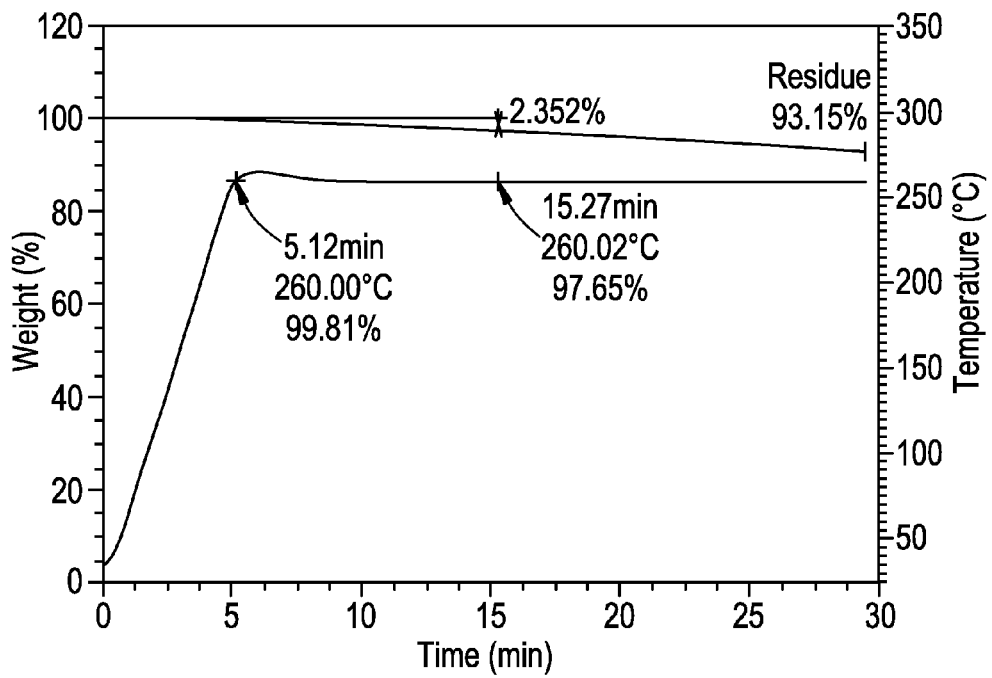
FIG. 11 is a graph depicting the Isothermal Decomposition Profile of SMM (2) when heated at 260° C. for 25 minutes under Nitrogen. The profile shows a small weight loss at of 2.35% after 10 minutes and 7% after 25 minutes isothermal heating.
Figure 12:
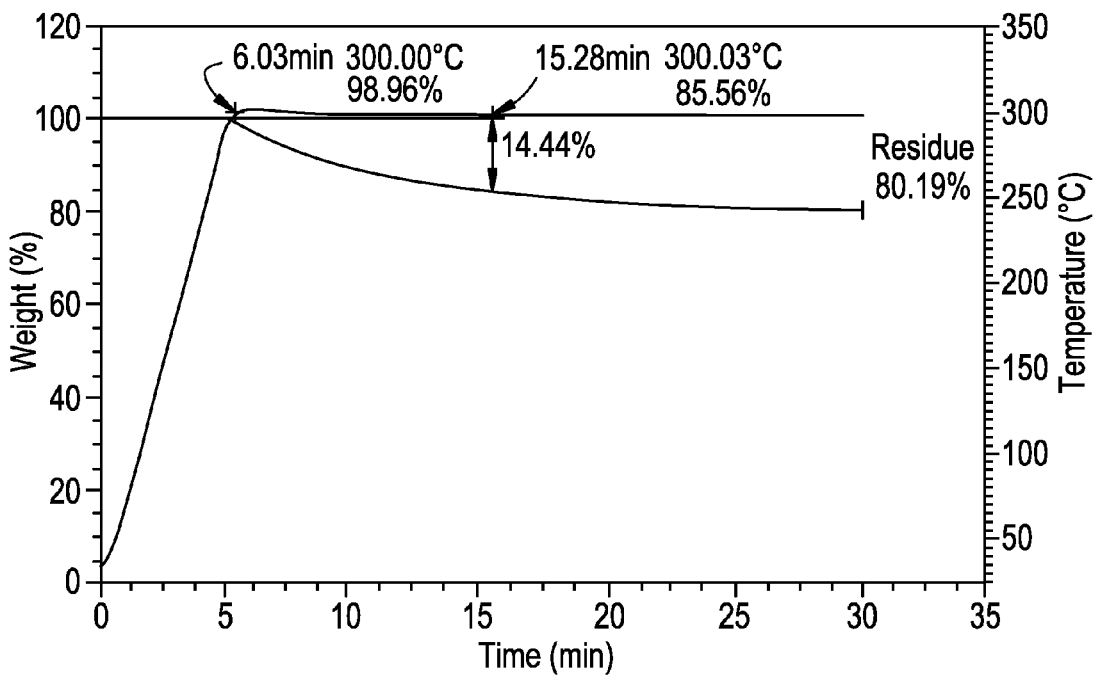
FIG. 12 is a graph depicting the Isothermal Decomposition Profile of SMM (2) when heated at 300° C. for 25 minutes under Nitrogen. The profile shows a 14% weight loss after 10 minutes and 20% weight loss after 25 minutes isothermal heating.
Figure 13A:
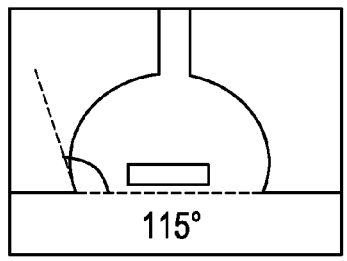
FIG. 13 is a series of pictures demonstrating how the surface of the base polymer polyethylene (PE) has been modified by the incorporation of an SMM. This is indicated by the shape and contact angle of a sessile drop of Water and 70% Isopropanol (IPA) onto the surface modified PE. The varying shape of the drop indicates that there is significant change in the contact angle with the control (unmodified) PE versus PE modified with SMM, both with water and 70% IPA solutiom: (a) PE control (base polymer) water, (b) PE modified with 5% SMM(1), (c) PE modified with 5% SMM(2), (d) PE in 70% isopropanol, (e) PE modified with 5% SMM(1) in 70% isopropanol, and (f) PE modified with 5% SMM(2) in 70% isopropanol.
Figure 13B:
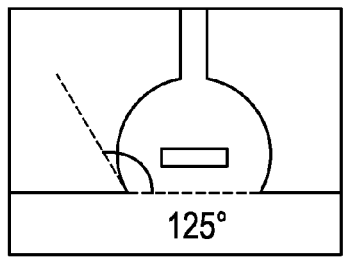
Figure 13C:
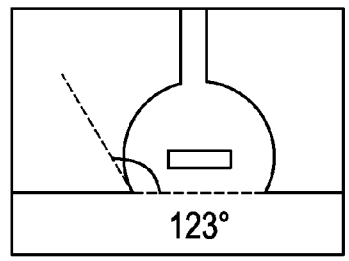
Figure 13D:
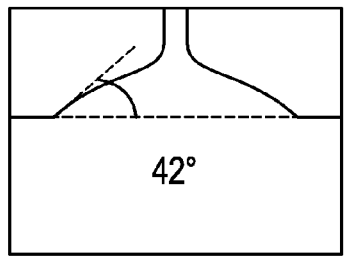
Figure 13E:
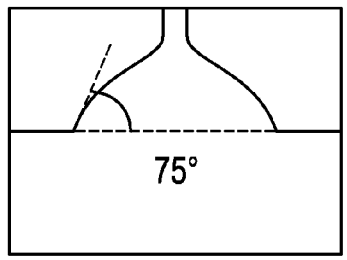
Figure 13F:
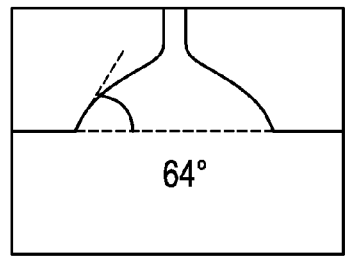

The methods and compositions of the invention feature thermally stable SMMs useful for the surface modification of a range of commercially available base polymers which are processed at high temperatures, such as polypropylene, polyethylenes, polyester, nylon 6, polyurethane and silicones, among others.

To provide the required functional properties the SMM additives in this invention are added into the desired base polymer during processing whether it is being extruded, melt-spun, spunbond, or injection molded. The additives can impart the following properties: (a) heat and chemical resistance, mechanical strength, (b) oil and water repellency, (b) surface smoothness, (c) resistance to hydrocarbons, acids, polar solvents and bases, (d) dimensional stability at high temperatures, (e) hydrophobic, non-adhesive surface, (f) hydrophilicity characteristics, (g) biocompatibility, (h) reduced thrombogenicity, and/or (i) surface hardness.

Surface modifiers of the invention can be prepared as described in U.S. Pat. No. 6,127,507, incorporated herein by reference, and in Examples 1-8. Surface modifiers, according to the invention, can be selected in a manner that they contain a soft segment selected to impart thermal stability. Such soft segments include hydrogenated-hydroxyl terminated polybutadiene, poly(2,2 dimethyl-1-3-propylcarbonate)diol, hydroxyl terminated polybutadiene polyol, poly(diethylene glycol)adipate, diethylene glycol-ortho phthalic anhydride polyester polyol, and 1,6-hexanediol-ortho phthalic anhydride polyester polyol. The invention also includes methods for increasing the thermal stability of an SMM using the synthetic methods described herein to improve their compatibility with the conditions characteristic of base polymer processing techniques. Desirably, the SMMs of the invention are prepared using catalysts that do not include tin, such as bismuth catalysts. It is believed that the presence of very small amounts of tin in the final product can catalyze the degradation of an SMM upon heating, leading to reduced thermal stability. The use of bismuth catalysts in the synthesis of urethanes is well known in the art (see, for example, U.S. Pat. Nos. 4,584,362; 4,742,090; 4,788,083; 5,064,871; and 6,353,057). Bismuth catalysts which can be purchased for use in the methods of the invention include Bi348, Bi221, and Bi601 (bismuth carboxylates, King Industries, Norwalk Conn.), as well as bismuth tris(neodecanoate) (NeoBi 200, Shepherd Chemicals).

The soft segment of the surface modifier can function as an anchor for the surface modifier within the base polymer substrate upon admixture. The surface active groups are responsible, in part, for carrying the surface modifier to the surface of the admixture, where the surface active groups are exposed on the surface. As a result, any loss of surface modifier at the surface of an article of the invention is replenished by the continued migration of surface modifier from the admixture to the surface. The latter process is believed to be driven by tendency towards establishing a low surface energy at the mixture's surface. When the balance between anchoring and surface migration is achieved, the surface modifier remains stable at the surface of the polymer, while simultaneously altering surface properties.

Suitable base polymers (which can be either thermoplastic or thermoset) include, without limitation, commodity plastics such as poly(vinyl chloride), polyethylenes (high density, low density, very low density), polypropylene, and polystyrene; engineering plastics such as, for example, polyesters (e.g., poly (ethylene terephthalate) and poly(butylene terephthalate)), polyamides (aliphatic, amorphous, aromatic), polycarbonates (e.g., aromatic polycarbonates such as those derived from bisphenol A), polyoxymethylenes, polyacrylates and polymethacrylates (e.g., poly(methyl methacrylate)), some modified polystyrenes (for example, styrene-acrylonitrile (SAN) and acrylonitrile-butadiene-styrene (ABS) copolymers), high-impact polystyrenes (SB), fluoroplastics, and blends such as poly(phenylene oxide)-polystyrene and polycarbonate-ABS; high-performance plastics such as, for example, liquid crystalline polymers (LCPs), polyetherketone (PEEK), polysulfones, polyimides, and polyetherimides; thermosets such as, for example, alkyd resins, phenolic resins, amino resins (e.g., melamine and urea resins), epoxy resins, unsaturated polyesters (including so-called vinyl esters), polyurethanes, allylics (e.g., polymers derived from allyldiglycolcarbonate), fluoroelastomers, and polyacrylates; and blends thereof.

The base polymer is combined with a surface modifier of the invention to form an admixture. Thermoplastic polymers are more preferred in view of their melt processability. The thermoplastic polymers are melt processable at elevated temperatures (e.g., above 200° C., 240° C., 270° C., or even 300° C.). Desirable thermoset base polymers for use in the admixtures of the invention include, without limitation, polypropylenes, polyethylenes, polyesters, polyurethanes, nylons, polysilicones, polystyrene, poly(methyl methacrylates), polyvinylacetates, polycarbonates, poly(acrylonitrile-butadiene), styrene, polyvinylchloride, and blends thereof.

The surface modifier is added prior to melt processing of the base polymer to produce various articles. To form an admixture by melt processing, the surface modifier can be, for example, mixed with pelletized or powdered polymer and then melt processed by known methods such as, for example, molding, melt blowing, melt spinning, or melt extrusion. The surface modifier can be mixed directly with the polymer in the melt condition or can first be pre-mixed with the polymer in the form of a concentrate of the surface modifier/polymer admixture in a brabender mixer. If desired, an organic solution of the surface modifier can be mixed with powdered or pelletized polymer, followed by evaporation of the solvent and then by melt processing. Alternatively, the surface modifier can be injected into a molten polymer stream to form an admixture immediately prior to extrusion into fibers, or any other desired shape.

After melt processing, an annealing step can be carried out to enhance the development of repellent characteristics of the base polymer. In addition to, or in lieu of, such an annealing step, the melt processed combination can also be embossed between two heated rolls, one or both of which can be patterned. An annealing step typically is conducted below the melt temperature of the polymer (e.g., at about 150-220° C. for up to 5 minutes in the case of polyamide).

The surface modifier is added to thermoplastic or thermosetting polymer in amounts sufficient to achieve the desired repellency properties for a particular application. Typically, the amount of surface modifier used is in the range of 0.05-15% (w/w) of the admixture. The amounts can be determined empirically and can be adjusted as necessary or desired to achieve the repellency properties without compromising other physical properties of the polymer.

For example, where the base polymer-SMM admixture is processed to produce melt-blowing or melt-spun fibers, these fibers can be used to make non-woven fabrics which have utility in any application where some level of repellency characteristics is desired. For example, the fabrics of the invention can be used for medical fabrics, medical and industrial apparel, fabrics for use in making clothing, home furnishings, and filtration systems, such as chemical process filters or respirators. Other applications are in the automotive and construction industries. The fabrics exhibit alcohol and water repellency characteristics. The fabrics can also exhibit oil repellency (and soil resistance) characteristics under a variety of environmental conditions and can be used in a variety of applications.

Non-woven webs or fabrics can be prepared by processes used in the manufacture of either melt-blowing or spunbonded webs. For example, a process similar to that described by Wente in "Superfine Thermoplastic Fibers," *Indus. Eng'g Chem.* 48, 1342 (1956) or by Wente et al. in "Manufacture of Superfine Organic Fibers," *Naval Research Laboratories Report No.* 4364 (1954) can be used. Multi-layer constructions made from non-woven fabrics enjoy wide industrial and commercial utility, for example, as medical fabrics. The makeup of the constituent layers of such multi-layer constructions can be varied according to the desired end-use characteristics, and the constructions can comprise two or more layers of melt-blowing and spunbonded webs in many useful combinations such as those described in U.S. Pat. No. 5,145,727 (Potts et al.) and U.S. Pat. No. 5,149,576 (Potts et al.), the descriptions of which are incorporated herein by reference. In multi-layer constructions, the surface modifier can be used in one or more layers to impart repellency characteristics to the overall construction.

Alternatively, the base polymer-SMM admixture is melt processed to produce a desired shape using an appropriate mold.

The following examples are put forth so as to provide those of ordinary skill in the art with a complete disclosure and description of how the methods and compounds claimed herein are performed, made, and evaluated, and are intended to be purely exemplary of the invention and are not intended to limit the scope of what the inventors regard as their invention.

The SMMs of the invention can be constructed by appropriate design combinations of the hard segments (diisocyanates), central soft segments (diols) and the fluorinated end-capping groups to form a wide range of polyurethanes with the desired high degradation temperatures specifically employing Bismuth catalysts in the polymerization. These include, but are not limited to the component reagents mentioned below.

Diisocyanates (Hard Segments)
HMDI=4,4'-methylene bis(cyclohexyl isocyanate)
IPDI=Isophorone Diisocyanate
TMXDI=m-tetramethylenexylene Diisocyanate
HDI=Hexamethylene Diisocyanate
Diols/Polyols (Soft Segments)
HLBH=Hydrogenated-hydroxyl terminated polybutadiene,
PCN=Poly(2,2 dimethyl-1-3-propylcarbonate)diol
PHCN=Poly(hexamethylene carbonate)diol
PEB=Poly(Ethylene-co-Butylene)diol
LBHP=Hydroxyl terminated polybutadiene polyol
PEGA=Poly(diethylene glycol)adipate
PTMO=Poly(tetramethylene Oxide)diol
PDP=Diethylene Glycol-Ortho phthalic Anhydride polyester Polyol
SPH=1,6-hexanediol-Ortho Phthalic anhydride polyester polyol
SPN=Neopentyl glycol-Ortho Phthalic Anhydride polyester polyol
BPAE=Bisphenol A Ethoxylate diol
Fluorinated End-Capping Groups
C8-FOH=1H,1H,2H,2H Perfluorooctanol
C10-FOH=1H,1H,2H,2H Perfluorodecanol
C8-C10 FOH=Mixtures of C8-FOH and C10-FOH
C5-FOH=1H,1H,5H,-perfluoro-1-pentanol
C4-FOH=1H,1H Perfluorobutanol
Non-Tin Based Catalyst
Bi348—Bismuth Carboxylate Type 1
Bi221—Bismuth Carboxylate Type 2
Bi601—Bismuth Carboxylate Type 3

The bismuth catalysts listed above can be purchased from King Industries (Norwalk Conn.). Any bismuth catalyst known in the art can be used to synthesize the SMMs of the invention.

EXAMPLE 1

General Synthetic Schemes

SMMs can be synthesized as shown in Scheme 1. Briefly, a polyol, such as polycarbonate, poly(ethylene-co-butylene) diol, or hydrogenated-hydroxyl terminated polybutadiene, is reacted with a diisocyanate at 65-70° C. in an organic solvent (e.g., dimethylacetamide, (DMAc) or toluene) in the presence of a catalyst to form a prepolymer. The ends of the prepolymer are then capped with a perfluorinated alcohol at 45° C. Because the reactions are moisture sensitive, the reactions are carried out under a nitrogen atmosphere under anhydrous conditions. The resulting SMM (if synthesis is performed in DMAC as solvent) is precipitated by addition of water and washed (e.g., with aqueous IPA/EDTA solutions, followed by IPA/Hexanes) prior to use. If the reaction is performed in toluene the resulting SMM is precipitated by addition of methanol and washed (e.g. THF/EDTA solutions, followed by further precipitations in methanol) prior to use.

Scheme 1

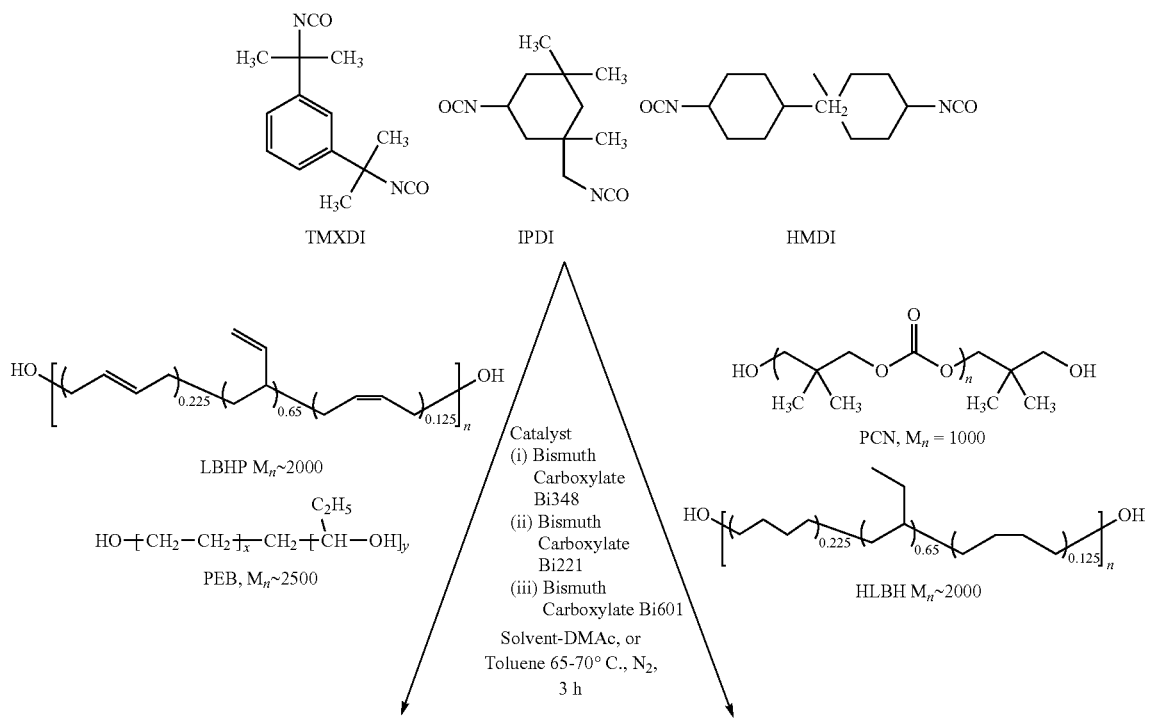

HMDI, IPDI, TMXDI = $R_1$----R = PEB, PCN, HLBH, LBHP---$R_1$ = HMDI, IPDI, TMXDI

Urethane Pre-Polymer

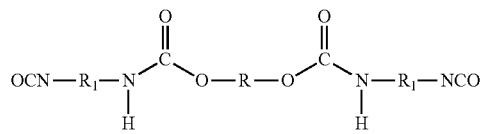

(C8-FOH) or---[-HDMI, IPDI, TMXDI----PEB, PCN, HLBH, LBHP-]$_z$---HDMI, IPDI, TMXDI----(C8-FOH or
(C5-FOH) or (C4-FOH)                                                                  (C5-FOH) or (C4-FOH)

EXAMPLE 2

Synthesis of SMM (1)

All glassware used for the synthesis was dried in an oven at 110° C. overnight. To a 3-necked 1000 ml oven dried flask equipped with a stir bar was added 175 g (72 mmol) of Hydrogenated-hydroxyl terminated polybutadiene (HLBH polyol, MW=2000). The flask with the polyol was degassed overnight and then purged with dry $N_2$. A 1000 mL graduated cylinder was filled with 525 mL anhydrous Toluene, sealed by a rubber septa and purged with dry $N_2$. The toluene was transferred to the 3-necked flask via a double-edged needle and the polyol stirred vigorously to dissolve in the solvent. The flask was placed in an oil bath at 65-70° C. 39.70 g (151 mmol) of 4,4'-methylene bis(cyclohexyl isocyanate) (HMDI) was added to a degassed 250 ml flask equipped with a stir bar. To this flask was added 150 ml of anhydrous toluene from a degassed, $N_2$ purged 250 ml septa-sealed cylinder also using a double-edged needle and the mixture was stirred to dissolve the HMDI in the solvent. To a degassed 50 ml round bottom flask was added 8.75 g (5.00% w/w based on diol) of the bismuth carboxylate catalyst followed by 26 ml of toluene to dissolve the catalyst. The HMDI solution was transferred to the 1000 ml flask containing the polyol. The bismuth catalyst solution was added (20 ml) immediately following the addition of the HMDI. The reaction mixture was allowed to stir for 5 h at 70° C. to produce a HMDI-HLBH prepolymer.

In another 50 ml round bottom flask 74.95 g (180 mmol) of C8-C10 FOH (mixture of C8-FOH and C10-FOH) was added, capped with a septa, degassed and then purged with $N_2$. This was added to the 1000 ml flask containing prepolymer. All additions and transfers were conducted carefully in an atmosphere of dry $N_2$ to avoid any contact with air. The resulting mixture was heated to 45° C. for 18 hours to produce SMM (1) with the end-capped C8-C10 FOH. The SMM solution was allowed to cool to ambient temperature and formed a milky solution. The milky solution was precipitated in MeOH (methanol) and the resulting precipitate was washed repeatedly with MeOH to form a white viscous material with dough-like consistency. This viscous, semi-solid material was washed twice in THF/EDTA (Ethylene Diamine Tetraacetic Acid) to remove residual catalyst followed by two more successive washes in THF/MeOH to remove unreacted monomers, low molecular weight byproducts, and catalyst residues. The SMM was first dried in a flow oven from at 40-120° C. in a period of 10 hours gradually raising the temperature and finally dried under vacuum at 120° C. (24 hours) and stored in a desiccator as a colorless rubbery semi-solid. The chemical structure of the SMM (1) is shown FIG. 14.

EXAMPLE 3

Synthesis of SMM(2)

Figure 14:
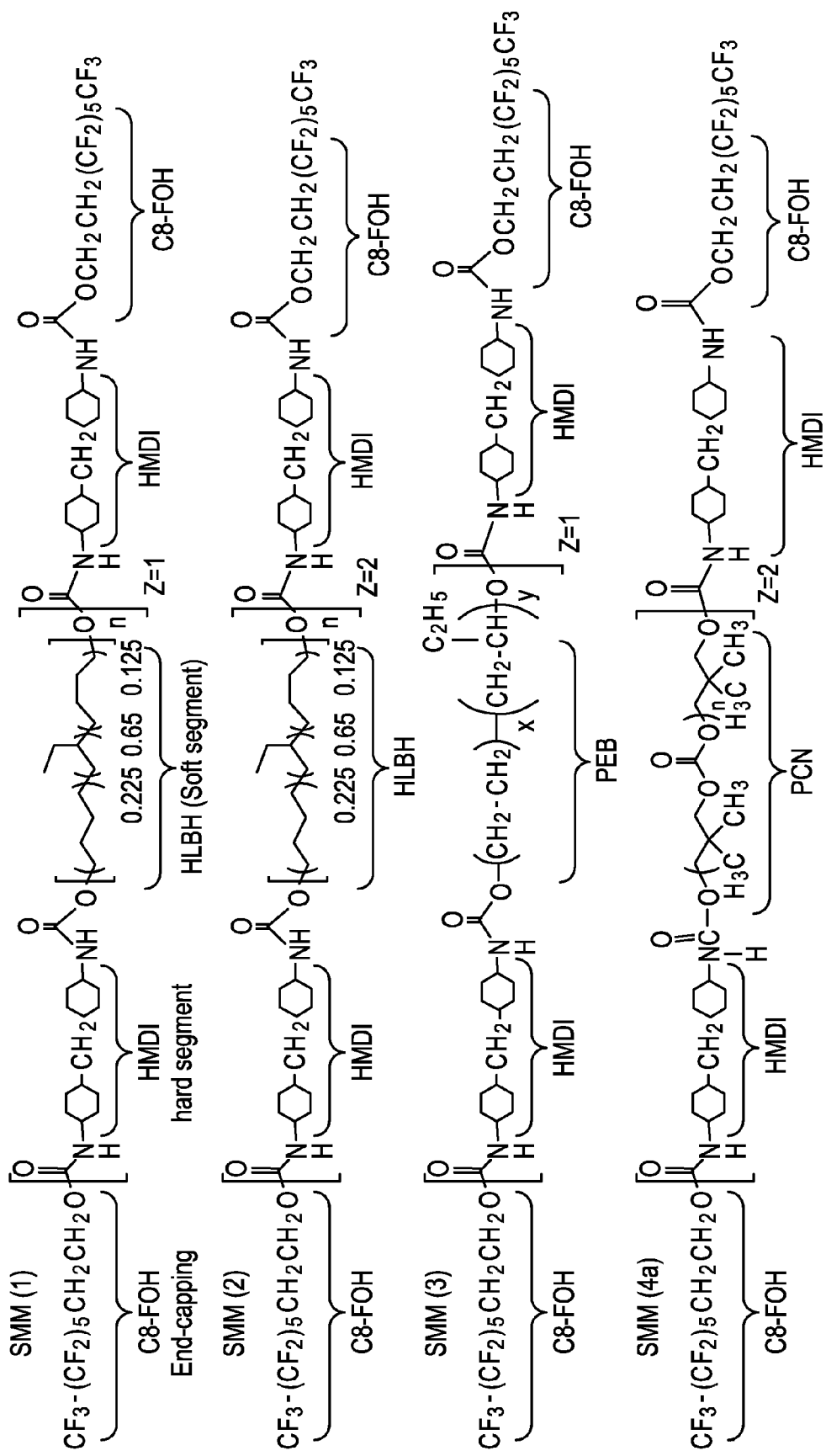
FIG. 14 is a series of drawings depicting the structures of SMMs (1), (2), (3), and (4a).

The reaction was carried out as described in Example 2 using 180 g (74 mmol) Hydrogenated-hydroxyl terminated polybutadiene (HLBH polyol, MW=2000) and 30.14 g (115 mmol) of 4,4'-methylene bis(cyclohexyl isocyanate) (HMDI) to form the prepolymer. The prepolymer was end-capped with 40.48 g (111.18 mmol) of 1H,1H,2H,2H-perfluoro-1-octanol (C8-FOH) to form SMM (2) as a colorless rubbery semi-solid. As described above, the couplings were carried out in the presence of bismuth carboxylate catalyst and the SMM was washed similarly to SMM (1) and dried prior to use. The chemical structure of the SMM (2) is shown in FIG. 14.

EXAMPLE 4

Synthesis of SMM (3)

The reaction was carried out as described in Example 3 using 10 g (4 mmol) poly(ethylene-co-butylene (PEB polyol, MW=2500) and 2.20 g (8.4 mmol) of 4,4'-methylene bis(cyclohexyl isocyanate) (HMDI) to form the prepolymer. The prepolymer was capped with 3.64 g (10 mmol) of 1H,1H,2H, 2H-perfluoro-1-octanol (C8-FOH) to form SMM (3). As described above, the couplings were carried out in the presence of bismuth carboxylate catalyst and the SMM was washed similarly to SMM (1) and dried prior to use. The chemical structure of the SMM (3) is shown in FIG. 14.

EXAMPLE 5

Synthesis of SMM (4a)

The reaction was carried out as described in Example 4, except the solvent was changed from toluene to DMAC. Here, 100 g (100 mmol) poly(2,2 dimethyl-1,3-propylcarbonate) diol (PCN, MW 1000) and 40.7 g (155 mmol) of 4,4'-methylene bis(cyclohexyl isocyanate) (HMDI) to form the prepolymer. The prepolymer was end-capped with 45.5 g (125 mmol) of 1H,1H,2H,2H-perfluoro-1-octanol (C8-FOH) to form SMM (4a). The work-up after the reaction and the subsequent washing procedures are modified from Example 4 as follows. The SMM from the reaction mixture in DMAC was precipitated in distilled water, and washed successively in IPA/EDTA (Isopropanol/Ethylene Diamine Tetraacetic Acid) solution followed by another wash in IPA/hexanes to remove unreacted monomers, low molecular weight byproducts and catalyst residues to yield SMM (4a) as a white amorphous powder. As described above, the couplings were carried out in the presence of bismuth carboxylate catalyst and dried under vacuum prior to use. The chemical structure of the SMM (4a) is shown in FIG. 14.

EXAMPLE 6

Synthesis of SMM (4b)

Figure 15:
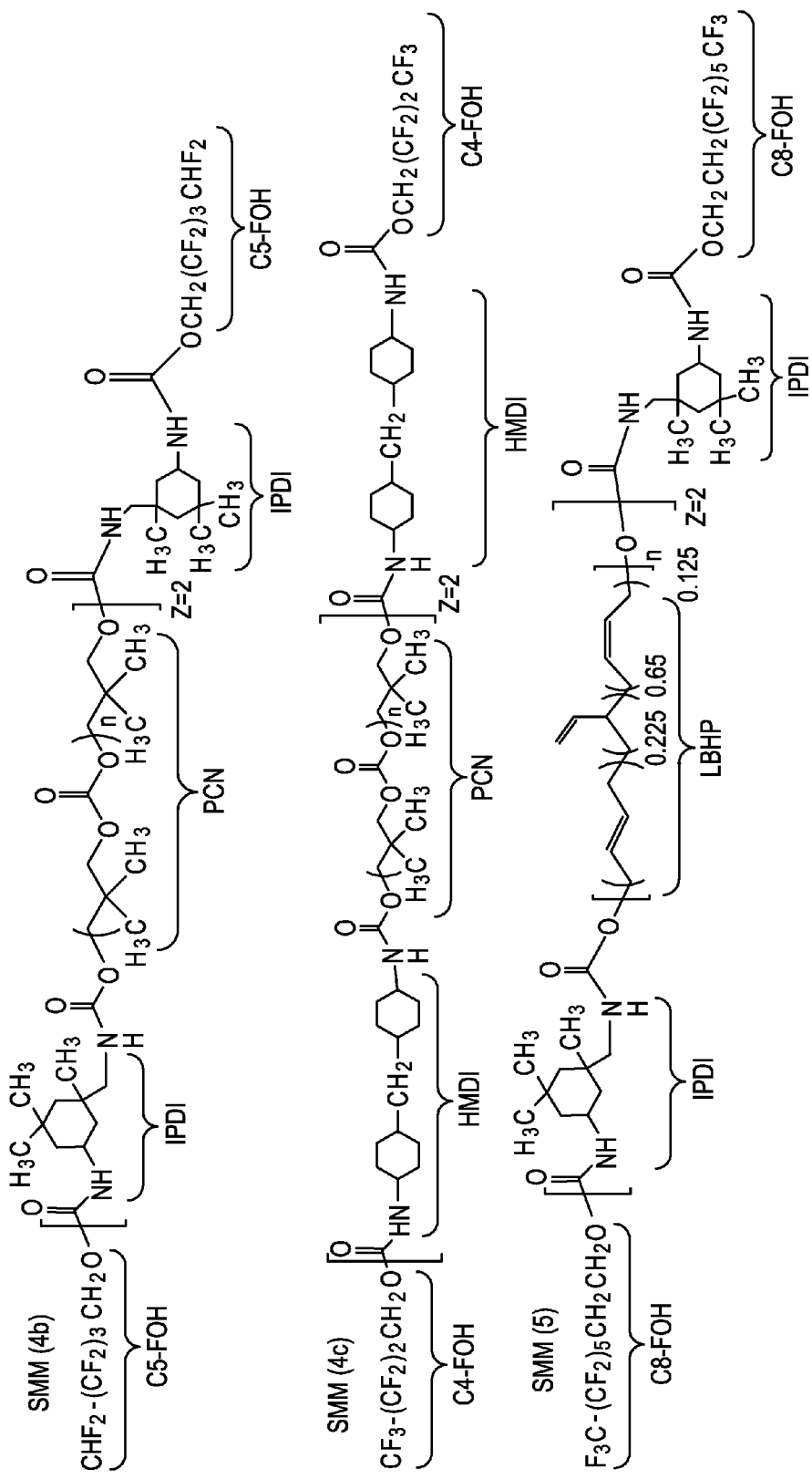
FIG. 15 is a series of drawings depicting the structures of SMMs (4b), (4c), and (5).

The reaction was carried out as described in Example 5 using 6.0 g (6.0 mmol) poly(2,2 dimethyl-1,3-propylcarbonate)diol (MW 1000) and 1.90 g (8.5 mmol) of isophorone diisocyanate (IPDI) to form the prepolymer. The prepolymer was end-capped with 1.4 g (6.0 mmol) of 1H,1H,5H,-perfluoro-1-pentanol (C5-FOH) to form SMM (3) as a white amorphous solid. As described above, the couplings were carried out in the presence of bismuth carboxylate catalyst and the SMM was washed similar to SMM (4a) and dried prior to use. The chemical structure of the SMM (4b) is shown in FIG. 15.

EXAMPLE 7

Synthesis of SMM (4c)

The reaction was carried out as described in Example 5 using 10.0 g (10.0 mmol) poly(2,2-dimethyl-1,3-propylcarbonate)diol (MW 1000) and 4.07 g (15.5 mmol) of 4,4'-methylene bis(cyclohexyl isocyanate) (HMDI) to form the prepolymer. The prepolymer was capped with 2.5 g (12.5 mmol) of 1H,1H-Perfluoro-1-butanol (C4-FOH) to form SMM 4c as a white amorphous solid. As described above, the couplings were carried out in the presence of bismuth carboxylate catalyst and the SMM was washed similar to SMM (4a) and dried prior to use. The chemical structure of the SMM (4c) is shown in FIG. 1

EXAMPLE 8

Synthesis of SMM(5)

The reaction was carried out as described in Example 5 using 180 g (84.8 mmol) Hydroxyl terminated polybutadiene (LBHP polyol, MW=2000) and 29.21 g (131.42 mmol) of isophorone diisocyanate (IPDI) to form the prepolymer. The prepolymer was capped with 46.31 g (127.18 mmol) of 1H,1H,2H,2H-perfluoro-1-octanol (C8-FOH) to form SMM (5) as a off-white opaque viscous liquid. As described above, the couplings were carried out in the presence of bismuth carboxylate catalyst and the SMM was washed similarly to SMM (4a) and dried prior to use. The chemical structure of the SMM (5) is shown in FIG. 15.

EXAMPLE 9

Synthesis of SMM(6)

Figure 16:
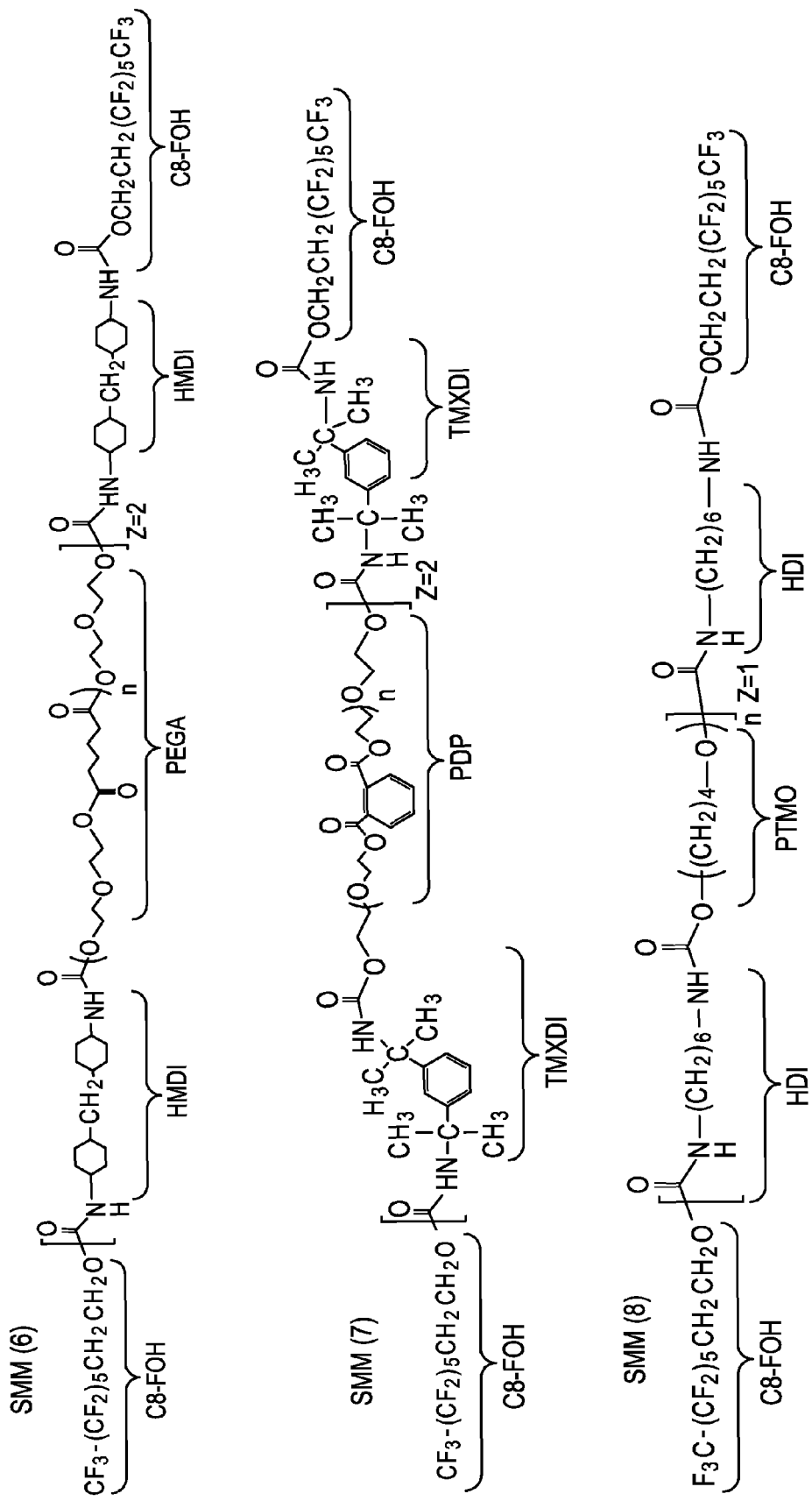
FIG. 16 is a series of drawings depicting the structures of SMMs (6), (7), and (8).

The reaction was carried out as described in Example 5 using 10 g (3.92 mmol) Poly(diethylene glycol adipate) (PEGA polyol, MW=2500) and 1.59 g (6.08 mmol) of 4,4'-methylene bis(cyclohexyl isocyanate) (HMDI) to form the prepolymer. The prepolymer was capped with 2.14 g (5.88 mmol) of 1H,1H,2H,2H-perfluoro-1-octanol (C8-FOH) to form SMM (6) as a off-white opaque viscous liquid. As described above, the couplings were carried out in the presence of bismuth carboxylate catalyst and the SMM was washed similarly to SMM (4a) and dried prior to use. The chemical structure of the SMM (6) is shown in FIG. 16.

EXAMPLE 10

Synthesis of SMM(7)

The reaction was carried out as described in Example 5 using 10 g (5.06 mmol), Ortho phthalate-diethylene glycol based Polyester polyol (PDP polyol, MW=2000) and 1.92 g (7.85 mmol) of m-tetramethylenexylene Diisocyanate (TMXDI) to form the prepolymer. The prepolymer was capped with 2.76 g (7.59 mmol) of 1H,1H,2H,2H-perfluoro-1-octanol (C8-FOH) to form SMM (7) as a colorless solid. As described above, the couplings were carried out in the presence of bismuth carboxylate catalyst and the SMM was washed similarly to SMM (4a) and dried prior to use. The chemical structure of SMM (7) is shown in FIG. 16.

EXAMPLE 11

Synthesis of SMM (8)

SMM (8), which includes a Poly(tetramethylene oxide), PTMO soft segment, has a degradation temperature of only 229° C. and is included for comparison. The SMM(8) material can be synthesized as described in U.S. Pat. No. 6,127,507. Both the prepolymer coupling and surface active group coupling were performed using dibutyl tin dilaurate as a catalyst.

EXAMPLE 12

Synthesis of SMM (9)

The theoretical structure of SMM (9) is identical to that of SMM (8). The SMM (9) material is synthesized using the methods of Example 5. Both the prepolymer coupling and surface active group coupling were performed using a Bi carboxylate catalyst to yield SMM (9) as a white amorphous solid.

EXAMPLE 13

Thermal Stability

The thermal degradation temperatures of the surface modifying macromolecules (SMM) were determined by a Thermogravimetric Analysis instrument (TGA). Thermogravimetric analysis (TGA) is often used to determine thermal stability by means of weight-loss decomposition profiles as a function of temperature. This was carried out using a TA instruments TGA Q500 (V6.3 Build 189 with autosampler) Thermogravimetric Analyzer operating in Dynamic (High Resolution), Hi-Res™ mode<resolution: 4, max ramp: 50° C./min, max temp: 500° C.

Briefly, 20-50 mg of each sample was placed into 100 μL platinum plans (part no. 952018.906) suspended from an analytical balance located outside the furnace chamber. After the balance was zeroed, the sample pan was heated from ambient to 500° C. in a Nitrogen atmosphere, $N_2$ (flow rate 40 cc/min balance, 60 cc/min. furnace). The Hi-Res TGA mode varies the heating rate as a function of sample weight loss rate, which allows the use of high heating rates during no weight loss regions and reduced heating rates at weight loss transitions to more accurately depict the decomposition characteristics of the test sample. This technique improves the reproducibility and resolution of onsets by separating overlapping or poorly defined events and it eliminates the dependence of decomposition behavior on the heating rate. A TGA plot indicating the weight loss and the rate of weight loss (or derivative) was plotted against the temperature using the Universal Analysis 2000 software (TA Instruments—Waters LLC, version 4.1D). If the material is completely dry, upon heating there is an onset (one or two depending upon the nature of the polymer) representing the start of degradation. As an illustrative example, FIG. 1 shows a High Resolution Thermogravimetric profile of SMM (1) indicating a first onset at a degradation temperature $T_{d1}$ 326° C. representing a minor weight loss (−0.87%) due to the hard segment (isocyanate linkage), followed by a major weight loss (−29.41%) at $T_{d2}$ of 405° C. due to the soft segment (polyol linkage) of the SMM's.

FIGS. 1-6 show the thermal degradation pattern of various examples of SMMs (1-6) depicted by a High Resolution Thermogravimetric Plot. The thermal data including TGA and DSC results are summarized in Table 1 below.

EXAMPLE 14

Differential Scanning Calorimetry

Differential Scanning calorimetry (DSC) was used to identify other thermal transitions of the SMM's, such as the glass transition temperature ($T_g$), of the amorphous phase or the melting points of the crystalline phases of the SMM's. The analysis was carried out using a TA Instruments Q100 (V9.6 Build 290) Differential Scanning calorimeter (DSC) with a TA Instruments Refrigerated Cooling System (RCS-90; 970008.902) and autosampler (part no. 971000.901). The analysis was performed under nitrogen with a flow rate of 50 cc/min.

Briefly, 2-10 mg of each sample were accurately weighed and hermetically sealed into aluminum pans (part no. 900793.901) with aluminum lids (900794.901). A second sealed empty pan was used as a reference. Both pans were placed on a thermoelectric disc that transfers heat to the pans from a controlled heating block. The temperature of the heating block was raised or lowered in a linear manner and the resulting differential heat flow to the sample and reference pans was monitored by a thermocouple.

For the first heating-cooling run the samples were heated from −90° C. to 150° C., cooled back down to −90° C. This was followed by a second heating-cooling run from −90° C. to 150° C. The heating and cooling rates were set at 10° C./min. Several heating and cooling scans (usually 2 or 3) were performed in this fashion to eliminate any artifacts associated with thermal history. The thermal transitions were identified by a change in heat capacity with temperature which is then plotted as a DSC plot. The DSC scans were analyzed with the Universal Analysis 2000 software (TA Instruments—Waters LLC, version 4.1D). Thermal transitions such as glass transition temperatures and melting points were calculated with the software for both the first and second heating, but only the data from the second heating was recorded.

The thermal transitions are related to the state of the hard and soft segments in the polymer chain. The $T_g$ is indicative of the transition from a stiff glassy state to an amorphous state where the mobility of the polymer backbone increases and is identified as a baseline shift in the DSC scan. The values in Table 1 for the $T_g$ shows the behavior of the soft segment as it responds to a change in temperature.

TABLE 1

TGA and DSC Analysis of Endexo ™ SMM's

| SMM | Wt % Hard | Wt % Soft | Wt % $F_T{}^a$ | $MW^b$ | TGA$^c$, ° C. $T_{d1}{}^d$ (% wt loss) | $T_{d2}{}^e$ (% wt loss) | $T_g{}^f$ | Appearance |
|---|---|---|---|---|---|---|---|---|
| 1 | 13.9 | 64.6 | 22 | 3785 | 326 (−0.9) | 406 (−29.4) | −44 | Colorless, Rubbery semi-solid |
| 2 | 12.4 | 76.2 | 11.4 | 6372 | 319 (−0.8) | 401 (−26) | −46 | Colorless, Rubbery semi-solid |
| 3 | 14.0 | 66.6 | 19.4 | 3753 | 220 (−0.8) | 424 (−28) | 26 | Waxy off-white solid |
| 4a | 22.4 | 56.9 | 20.7 | 3515 | 284 (−0.5) | 288 (−>75) | 28 | White amorphous solid |
| 4b | 21.3 | 63.9 | 14.8 | 3131 | 270 (−1) | 337 (−99) | 10 | White chunky solid |
| 4c | 24.7 | 62.8 | 12.6 | 3187 | 272 (−4) | 341 (−40) | 28 | White amorphous solid |
| 5 | 11.8 | 75.3 | 12.9 | 5641 | 283 (−2.6) | 407 (−31.2) | −46 | colorless viscous liquid |
| 6 | 11.9 | 77.1 | 11.0 | 6617 | 311 (−1.9) | 374 (−29) | −38 | colorless viscous liquid |
| 7 | 13.5 | 73 | 13.5 | 5411 | 263 (−0.9) | 363 (−29) | 19 | colorless solid |
| 8 | 16.3 | 48.5 | 35.3 | 2065 | 229 (−1.3) | 353 (−57) | −75 | White amorphous solid |
| 9 | 16.3 | 48.5 | 35.3 | 2065 | 276 (−2) | 407 (65) | 30 | White amorphous solid |

$^a$% F end-capping groups $^b$Theoretical Molecular Weight in Daltons.

$^c$High Resolution Thermographic Analysis under $N_2$ $^d$Degradation Temperature $T_{d1}$° C., from the first onset, represents the hard segment, $^e$Degradation $T_{d2}$° C. of the soft segment, from the second onset.

$^f$Glass Transition Temperature (° C.) in a Differential Scanning Calorimeter after second heat.

As shown in Table 1, a large increase in thermal stability may be achieved by choosing the appropriate soft segment or diol unit. For example, use of a soft segment selected from a polyolefinic group, such as polybutadiene, hydrogenated polybutadienes or poly(ethylene-co-butylene) (SMM's 1, 2, 3, 5), or polycarbonate polyol (SMM's 4a, 4b, 4c), poly (diethylene glycol) adipate or ortho phthalate-diethylene glycol polyester polyol (SMM's 6, 7) can increase the thermal stability of the SMM. This is quite evident by comparing the thermal degradation temperatures of SMM's (1-7) with SMM's 8 and 9 which are based on polyether polyols only. For example, comparing the TGA data of SMM (1) and (2) vs SMM (8) the $T_{d1}$ of SMM (1) and SMM (2) are 326 and 319° C. which is considerable higher than SMM (8) with a $T_{d1}$=229° C.

Furthermore, a significant increase in stability is observed for materials coupled using bismuth carboxylate catalyst rather than dibutyl tin dilaurate (i.e., compare SMM (8), $T_{d1}$=229° C. to SMM (9), $T_{d1}$=276° C.). A further advantage in working with bismuth catalyst is that it is non-toxic and environmentally friendly compared to tin catalysts. It is believed that Bismuth catalysts are more selective in its reactivity and avoid potential side reactions with isocyanate leading to urea linkages in the presence of trace amounts of water. These side reactions can disrupt symmetry in the main-chain of the SMM, affecting thermal properties, such as $T_d$ and $T_g$.

EXAMPLE 15

Carbothane™, Polyethylene (PE) and Polypropylene (PP)-SMM Admixtures

Solution cast films were made from three different base polymers that are widely used in industry. These are Carbothane™ (Shore hardness 85 A), polyethylene (PE) and polypropylene (PP). The base polymers were admixed with selective SMM's in 4-5% (w/w) in the appropriate solvent to give a range of admixtures. For example, Carbothane was admixed with SMM 3, 4a, or 8 in DMAC solvent and films were cast on Teflon™ or Aluminum substrates. In another instance PE was admixed with SMM's 1, 2, 3, 4a, 5, or 8 in chlorobenzene solvent and films were cast on glass substrate. Finally, PP was admixed with SMM 1 and 2 in chlorobenzene solvent and films formed on glass substrates.

EXAMPLE 16

Surface Elemental Analysis by X-Ray Photoelectron Spectroscopy (XPS)

Carbothane™ (Thermedics Inc MA, USA), PE and PP were used as control polymer and the base polymer-SMM admixtures of Example 15 were analyzed by XPS to determine the concentration of surface fluorine (hydrophobic) as well as the Urethane chemistries (polar groups). The measurements were performed at a single take-off angle of 90° corresponding to a depth of 100 Å and analyzed using a surface area of 4×7 mm²—sufficiently representative of the film being analyzed—which was bombarded with the X-Rays. The films were investigated for relative atomic percentages of Fluorine (F), Oxygen (O), Nitrogen (N), Carbon (C) and Silicon. Only the results of atomic % of Fluorine (F), the element of interest, for 3 different base polymers used as control as well as modified with SMM's are provided as illustrations in Table 2.

EXAMPLE 17

Contact Angle Measurements

Contact angle is a useful measure of the surface properties of materials (e.g. to measure relative wettability). Carbothane™ (Thermedics Inc MA, USA), PE and PP were used as control polymer and the base polymer-SMM admixtures of Example 15 were analyzed. The advancing and receding contact angle of water and advancing contact angle of 70% isopropanol solution on the films were measured using a Kruss Drop Shape Analysis system (DSA100). Solutions were injected with a 500 µl Syringe (part no. SY20) and a 0.5 mm diameter, 25 mm length needle (part no. NE13). Images were captured using the built in digital camera connected to a computer and processed using the Kruss Drop Shape Analysis DSA1 software.

Sample Preparation

Films were cut into 1 cm by 5 cm strips and mounted at the edges of glass slides with double-sided tape. All mounted samples were dried at room temperature under vacuum overnight prior to analysis.

Drop Parameters:

Drop size: 20 µl

Drop rate: 30 µl/sec

Drop Type: sessile drop

Advancing and receding angles were measured by capturing the instantaneous advancing and receding images of the solution drop. The advancing contact angle was taken after injecting 20 µl onto the surface of the film, keeping the needle inside the bubble. After an additional 20 µl was injected into the bubble, 20 µl was retracted from the bubble and the receding angle was taken immediately. The images were processed with Kruss Drop Shape Analysis DSA1 software and the contact angles on both sides of the drop was measured using "Tangent method 2", which determines the slope of the three-phase contact point at the manually selected baseline. If the surfaces are hydrophilic the liquid is attracted towards the surface and so the angles will be low. Similarly for hydrophobic surfaces the liquid will try to make minimum contact with the surface and so the contact angles will be high. Subsequently, receding angles are also measured by partially withdrawing the water droplet. In many cases there is a distinct difference between the Advancing and Receding angles called the contact angle hysteresis. This is a measure of the surface topography (smooth or rough surface), chemical heterogeneity and changes in chemistry. The results of the advancing angles in both water and 70% IPA solutions with the same base polymers as mentioned in Example 16 are also provided in Table 2. Six measurements were taken and on each side of the drop and these were averaged.

TABLE 2

XPS and Contact Angle Analysis of SMM-modified Carbothane ™, PP, and PE Films

| Analysis | Base Polymer | SMM (1) 0% | SMM (1) 4-5% | SMM (2) 0% | SMM (2) 4-5% | SMM (3) 0% | SMM (3) 4-5% | SMM (4a) 0% | SMM (4a) 4-5% | SMM (5) 0% | SMM (5) 4-5% | SMM (8) 0% | SMM (8) 4-5% |
|---|---|---|---|---|---|---|---|---|---|---|---|---|---|
| XPS - Surface F (atm %) | PU[a] | — | — | — | — | 0 | 20 | 0 | 24 | — | — | 0 | 40 |
| | PE[b] | 0 | 18 | 0 | 20 | 0 | 44 | 0 | 24 | 0 | 8 | 0 | 38 |
| | PP[c] | 0 | 21 | 0 | 21 | — | — | — | — | — | — | — | — |
| Contact Angle Advancing in Water | PU | — | — | — | — | 101 | 121 | 101 | 115 | — | — | 101 | 121 |
| | PE | 108 | 125 | 108 | 123 | 108 | 119 | 108 | 122 | 108 | 116 | 108 | 115 |
| | PP | 108 | 117 | 108 | 115 | — | — | — | — | — | — | — | — |
| Contact Angle Advancing in 70% IPA Solution | PU | — | — | — | — | 45 | 70 | 45 | 73 | — | — | 45 | 66 |
| | PE | 43 | 75 | 43 | 64 | 43 | 82 | 43 | 75 | 43 | 75 | 43 | 75 |
| | PP | 33 | 71 | 33 | 76 | — | — | — | — | — | — | — | — |

[a] PU = A commercial Polyurethane e.g. Carbothane ™ (Thermedics Inc MA, USA).
[b] PE = A commercial Polyethylene
[c] PP = A commercial Polypropylene In each example, the admixtures of SMM with base polymer exhibit a substantial amount of surface fluorine (see XPS data comparing 0% SMM to 4-5% SMM formulations), which in turn increases both the water and alcohol repellency of the SMM admixtures (see the (see the contact angle data in water and alcohol comparing 0% SMM to 4-5% SMM formulations).

In contrast, when SMM (8) ($T_{d1}$=229° C., see Table 1) was admixed with PE at 4% with compounding in an extruder at 220° C., substantial degradation of the SMM was observed (evidenced by evolution of fumes and condensed liquid). The resulting admixture exhibited reduced surface fluorine content and reduced water and alcohol repellency in comparison to admixtures formed without degradation.

EXAMPLE 18

Data for Additional SMMs

Other SMMs were prepared using the methods described above. The thermal degradation properties of these SMMs are summarized below in Table 3.

TABLE 3

SMM Hard, Soft, Fluoro end groups Segments and Degradation Temperatures

| Soft Segment-MW Polyol (%) | Hard Segment Diisocyanate (%) | Fluoro End Groups (%) | TGA ° C. ($N_2$)[a] $T_{d1}$ | TGA ° C. ($N_2$)[a] $T_{d2}$ |
|---|---|---|---|---|
| HLBH-2000 (64.6) | HMDI (13.9) | C8-C10 FOH (22) | 326 | 406 |
| HLBH-2000 (66.0) | HMDI (14.3) | C8-FOH (19.8) | 312 | 402 |
| HLBH-2000 (77.7) | IPDI (10.7) | C8-FOH (11.6) | 302 | — |
| HLBH-3000 (83.0) | IPDI (8.1) | C8-FOH (8.9) | 270 | — |
| HLBH-2000 (76.2) | HMDI (12.4) | C8-FOH (11.4) | 319 | 401 |
| HLBH-2000 (76.9) | TMXDI (11.6) | C8-FOH (11.5) | 337 | — |
| HLBH-2000 (80.4) | HMDI (11.6) | C8-FOH (8.0) | 321 | 397 |
| PCN-1000 (56.9) | HMDI (22.4) | C8-FOH (20.7) | 284 | 288 |
| PCN-1000 (57.8) | TMXDI (21.2) | C8-FOH (21.0) | 275 | 296 |
| PCN-1000 (63.9) | IPDI (21.3) | C5-FOH (14.8) | 270 | 337 |
| PCN-1000 (62.8) | HMDI (24.7) | C4-FOH (12.6) | 272 | 341 |
| PHCN-2000 (72.5) | HMDI (14.3) | C8-FOH (13.2) | 247 | 300 |
| PHCN-2000 (73.2) | TMXDI (13.4) | C8-FOH (13.3) | 204 | 308 |
| PEB-2500 (66.6) | HMDI (14.0) | C8-FOH (19.4) | 220 | 424 |
| PEB-2500 (67.3) | TMXDI (13.1) | C8-FOH (19.6) | 201 | 408 |
| LBHP-2000 (75.3) | IPDI (11.8) | C8-FOH (12.9) | 283 | 407 |
| LBHP-2000 (74.4) | TMXDI (12.8) | C8-FOH (12.8) | 231 | 407 |
| LBHP-2000 (64.4) | IPDI (13.5) | C8-FOH (22.1) | 210 | 404 |
| LBHP-2000 (79.7) | IPDI (11.1) | C8-FOH (9.1) | 233 | 404 |
| LBH-2000 (74.3) | IPDI (12.3) | C8-FOH (13.4) | 248 | 435 |
| PEGA-2000 (78.5) | IPDI (10.3) | C8-FOH (11.2) | 241 | 364 |
| PEGA-2000 (77.1) | HMDI (11.9) | C8-FOH (11.0) | 311 | 374 |
| PEGA-2000 (77.7) | TMXDI (11.2) | C8-FOH (11.1) | 246 | 350 |
| PDP-2000 (73.9) | IPDI (12.5) | C8-FOH (13.6) | 270 | 340 |
| PDP-2000 (72.3) | HMDI (14.4) | C8-FOH (13.3) | 230 | 340 |
| PDP-2000 (73.0) | TMXDI (13.5) | C8-FOH (13.5) | 263 | 363 |
| SPN-1000 (57.7) | HMDI (22.0) | C8-FOH (20.3) | 206 | 309 |
| SPH-2000 (72.7) | HMDI (14.2) | C8-FOH (13.1) | 257 | 334 |
| BPAE-1000 (39.4) | HMDI (31.5) | C8-FOH (29.1) | 229 | 318 |

Other Embodiments

All publications, patents, and patent applications mentioned in this specification are herein incorporated by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

What is claimed is:

1. A surface modifier of formula (I):

$$G-[B-A]_n-B-G \qquad (I)$$

wherein (i) A is a soft segment comprising poly(hexamethylene carbonate)diol (PHCN); poly(ethylene-co-butylene) diol (PEB); 1,6-hexanediol-orthophthalic anhydride polyester polyol (SPH); or neopentyl glycol-ortho phthalic anhydride polyester polyol (SPN);
(ii) B is a hard segment comprising a urethane formed from a diisocyanate selected from 4,4'-methylene bis(cyclohexyl isocyanate)(HMDI); isophorone diisocyanate (IPDI); or m-tetramethylxylene diisocyanate (TMXDI); and
(iii) G is a polyfluoroalkyl group;
wherein n is an integer from 1 to 10,
and wherein said surface modifier has a theoretical molecular weight of less than 10,000 Daltons.

2. The surface modifier of claim 1, wherein n is 1.

3. The surface modifier of claim 1, wherein said diisocyanate is 4,4'-methylene bis(cyclohexyl isocyanate) (HMDI).

4. The surface modifier of claim 1, wherein said soft segment has a number average molecular weight, $M_n$, of 1,000 to 3,500 Daltons.

5. The surface modifier of claim 1, wherein G has a molecular weight of between 100-1,500 Daltons.

6. The surface modifier of claim 1, wherein said polyfluoroalkyl group is
(a) selected from the group consisting of radicals of the general formulas
  (i) $(CF_3(CF_2)_rCH_2CH_2-$ wherein r is 2-20; and
  (ii) $CF_3(CF_2)_s(CH_2CH_2O)_\chi$ wherein $\chi$ is 1-10 and s is 1-20; or
(b) said polyfluoroalkyl group is formed from 1H,1H,2H,2H-perfluoro-1-decanol; 1H,1H,2H,2H-perfluoro-1-octanol; 1H,1H,5H-perfluoro-1-pentanol; or 1H,1H,perfluoro-1-butanol, or mixtures thereof.

7. The surface modifier of claim 6, wherein said polyfluoroalkyl group is formed from 1H,1H,2H,2H-perfluoro-1-octanol.

8. The surface modifier of claim 1, wherein
(i) A is a soft segment comprising poly(ethylene-co-butylene)diol (PEB); and
(ii) B is a hard segment formed from 4,4'-methylene bis(cyclohexyl isocyanate) (HMDI).

9. The surface modifier of claim 8, wherein the polyfluoroalkyl group is formed from 1H,1H,2H,2H-perfluoro-1-octanol.

10. The surface modifier of claim 1, wherein
(i) A is a soft segment comprising neopentyl glycol-ortho phthalic anhydride polyester polyol (SPN); and
(ii) B is a hard segment formed from 4,4'-methylene bis(cyclohexyl isocyanate) (HMDI).

11. The surface modifier of claim 10, wherein the polyfluoroalkyl group is formed from 1H,1H,2H,2H-perfluoro-1-octanol.

12. The surface modifier of claim 1, wherein
(i) A is a soft segment comprising 1,6-hexanediol-orthophthalic anhydride polyester polyol (SPH); and
(ii) B is a hard segment formed from 4,4'-methylene bis(cyclohexyl isocyanate) (HMDI).

13. The surface modifier of claim 12, wherein the polyfluoroalkyl group is formed from 1H,1H,2H,2H-perfluoro-1-octanol.

14. The surface modifier of claim 1, wherein
(i) A is a soft segment comprising poly(hexamethylene carbonate)diol (PHCN); and
(ii) B is a hard segment formed from m-tetramethylxylene diisocyanate (TMXDI).

15. The surface modifier of claim 14, wherein the polyfluoroalkyl group is formed from 1H,1H,2H,2H-perfluoro-1-octanol.

16. An admixture comprising the surface modifier of claim 1 admixed with a base polymer.

17. The admixture of claim 16, wherein said base polymer is selected from polypropylenes, polyethylenes, polyesters, polyurethanes, nylons, polysilicones, polystyrenes, poly(methyl methacrylates), polyvinylacetates, polycarbonates, poly(acrylonitrile-butadiene)s, styrene, and polyvinylchlorides, and blends thereof.

18. The admixture of claim 17, wherein said admixture comprises from 0.05% to 10% (w/w) of said surface modifier.

19. An article formed from the admixture of claim 16.

20. The article of claim 19, wherein said article is an implantable medical device.

\* \* \* \* \*